United States Patent
Koshio

(12) 
(10) Patent No.: US 6,392,143 B1
(45) Date of Patent: May 21, 2002

(54) FLEXIBLE PACKAGE HAVING VERY THIN SEMICONDUCTOR CHIP, MODULE AND MULTI CHIP MODULE (MCM) ASSEMBLED BY THE PACKAGE, AND METHOD FOR MANUFACTURING THE SAME

(75) Inventor: Yasuhiro Koshio, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/482,609

(22) Filed: Jan. 14, 2000

(30) Foreign Application Priority Data

Jan. 18, 1999 (JP) .......................................... 11-009682

(51) Int. Cl.$^7$ .............................................. H01L 23/02
(52) U.S. Cl. ...................... 174/52.4; 174/254; 174/260; 361/749; 361/760; 257/778
(58) Field of Search ............................... 174/52.2, 52.3, 174/52.4, 250, 254; 361/748, 749, 750, 751, 760, 764, 767, 772, 773; 257/685, 686, 704, 723, 724, 778

(56) References Cited

U.S. PATENT DOCUMENTS

| | | | |
|---|---|---|---|
| 4,705,360 A | * 11/1987 | Funada et al. ............... | 350/344 |
| 4,792,532 A | 12/1988 | Ohtani et al. | |
| 5,450,283 A | * 9/1995 | Lin et al. ..................... | 361/704 |
| 5,563,446 A | * 10/1996 | Chia et al. ................... | 257/704 |
| 5,646,446 A | * 7/1997 | Nicewarner, Jr. et al. ... | 257/723 |
| 5,811,877 A | 9/1998 | Miyano et al. | |
| 5,838,061 A | 11/1998 | Kim | |
| 6,051,877 A | * 4/2000 | Usami et al. ................ | 257/679 |

FOREIGN PATENT DOCUMENTS

| | | |
|---|---|---|
| DE | 195 42 883 A1 | 8/1996 |
| EP | 0 729 184 A2 | 8/1996 |
| EP | 0 729 184 A3 | 11/1999 |
| JP | 3-120746 | 5/1991 |
| JP | 9-260527 | 10/1997 |

OTHER PUBLICATIONS

Derwent Abstract of DE 195 42 883 A1.
IBM Technical Disclosure Bulletin, "Stacked Tab Chip Carrier," vol. 33, No. 6A (1990).
European Search Report dated May 2, 2000.
Copy of Korean Office Action dated Dec. 22, 2001, and copy of English–language translation thereof.

* cited by examiner

*Primary Examiner*—Dean A. Reichard
*Assistant Examiner*—Carmelo Oliva
(74) *Attorney, Agent, or Firm*—Finnegan, Henderson, Farabow, Garrett & Dunner, L.L.P.

(57) ABSTRACT

There is provided a flexible package which includes a flexible substrate on a principal surface of which a plurality of metal wirings are formed, a flexible semiconductor chip attached over the flexible substrate and having a plurality of bonding pads thereon, joint metals for connecting electrically the plurality of bonding pads and the plurality of metal wirings respectively, and a sealing member sandwiched between the flexible substrate and the flexible semiconductor chip. The flexible semiconductor chip in which thickness of the semiconductor chip is reduced smaller than the normally-used thickness to lower the rigidity is mounted. Also, the rigidity of the overall package is made smaller by reducing thicknesses of respective constituent parts of the package such as the flexible substrate, etc. Therefore, generation of the package crack due to displacement can be avoided. In addition, since the sealing member is sandwiched between the flexible substrate and the flexible semiconductor chip, the warpage of the package can be suppressed extremely small. Therefore, flatness of the flexible package as a single product can be assured sufficiently. Further, if a packaging substrate on a principal surface of which a plurality of packaging wirings are formed is prepared and then the plurality of packaging wirings are connected electrically to the plurality of metal wirings respectively, the module with high packaging reliability can be constructed. Moreover, if a plurality of flexible packages are laminated, a MCM having a small total thickness can be constructed.

30 Claims, 17 Drawing Sheets

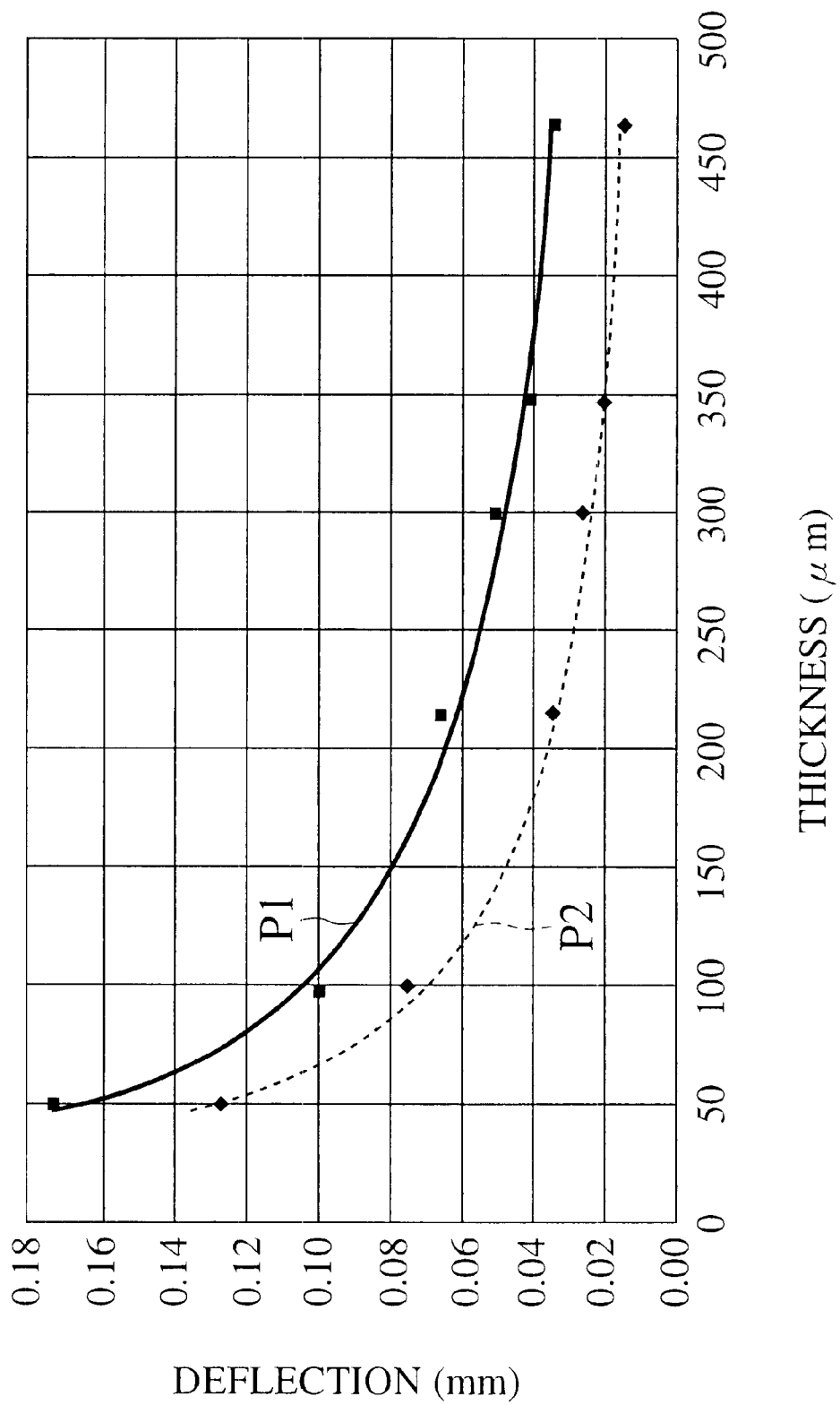

5mm  $\theta \leq 10°$

5mm  $\theta \geq 80°$

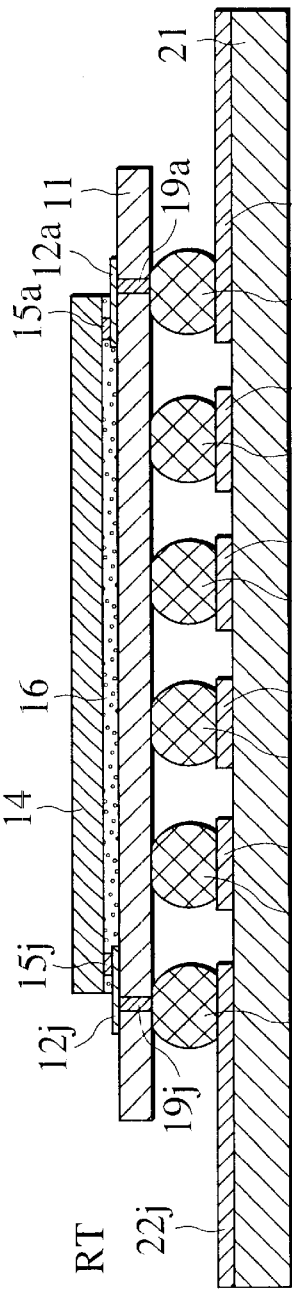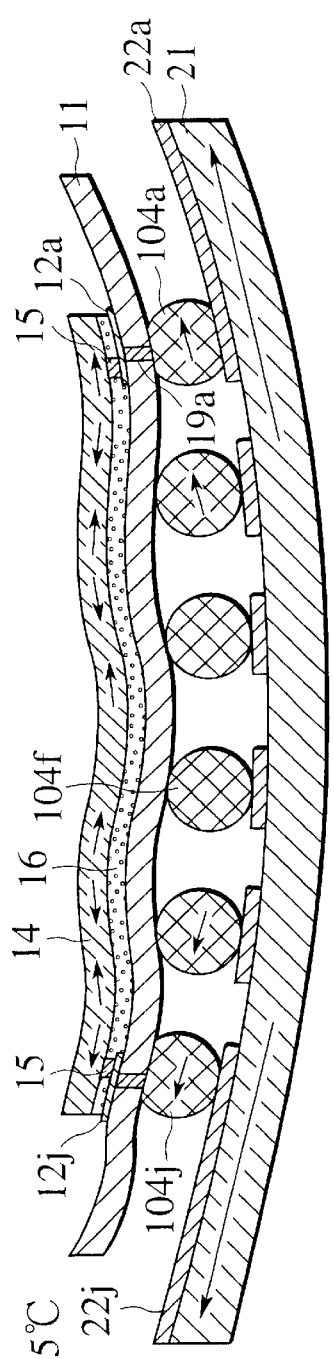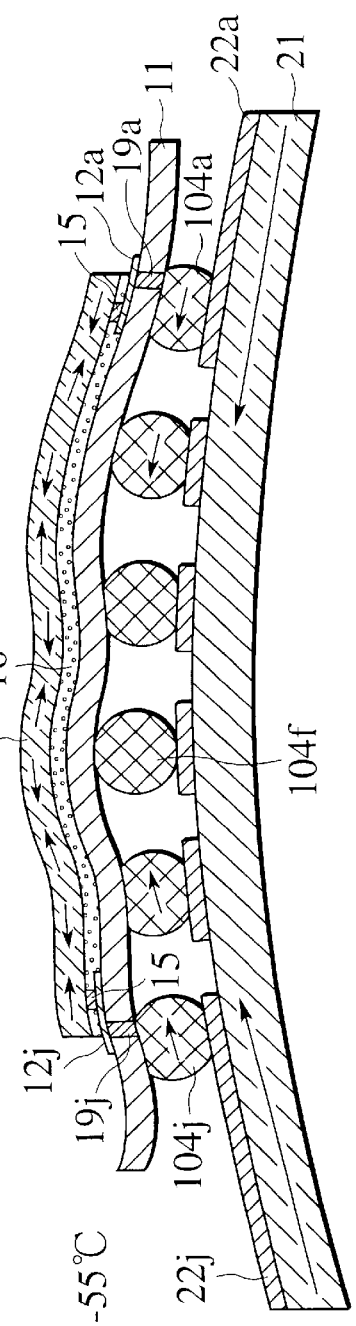
FIG.5A RT
FIG.5B 125°C
FIG.5C -55°C

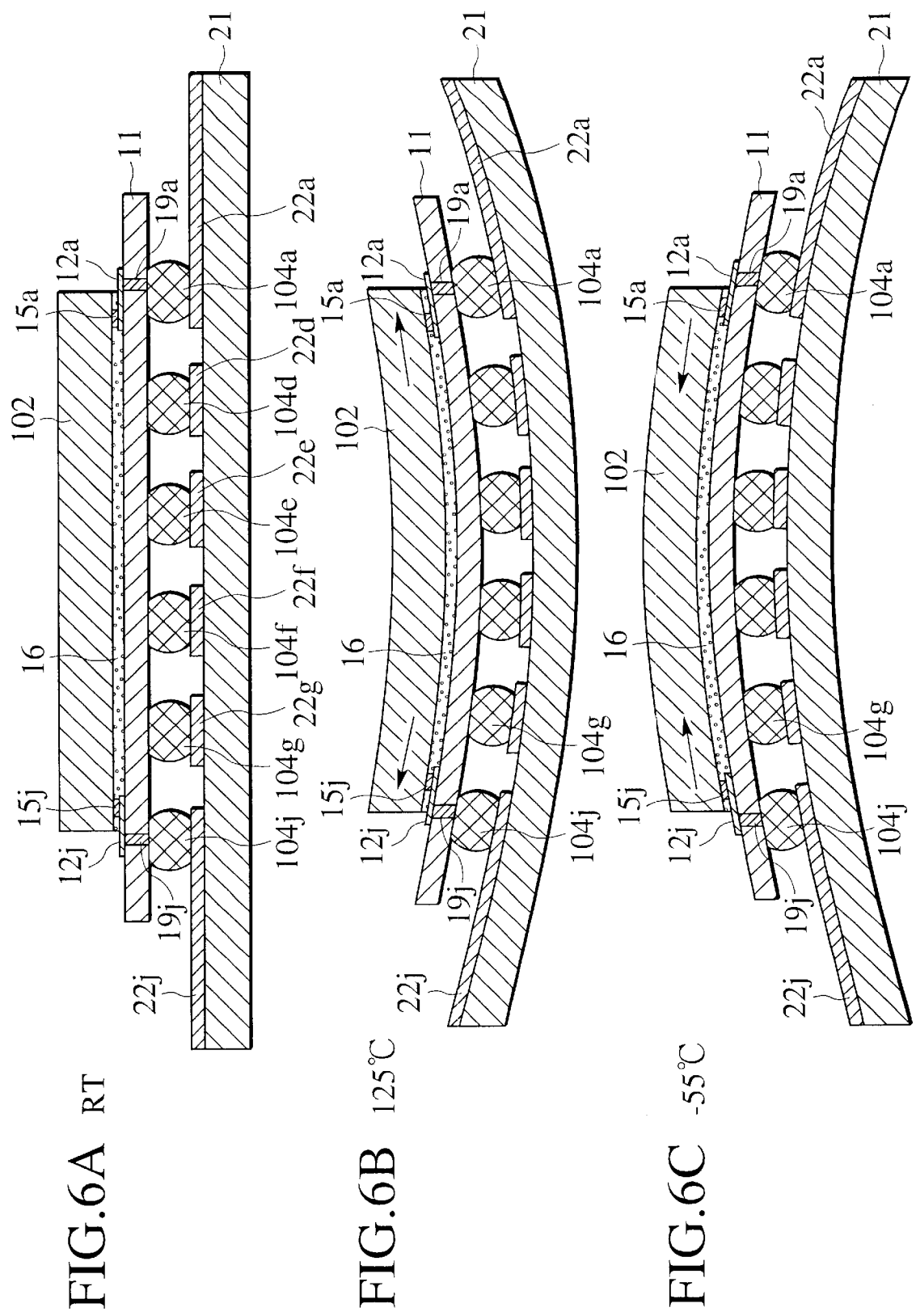

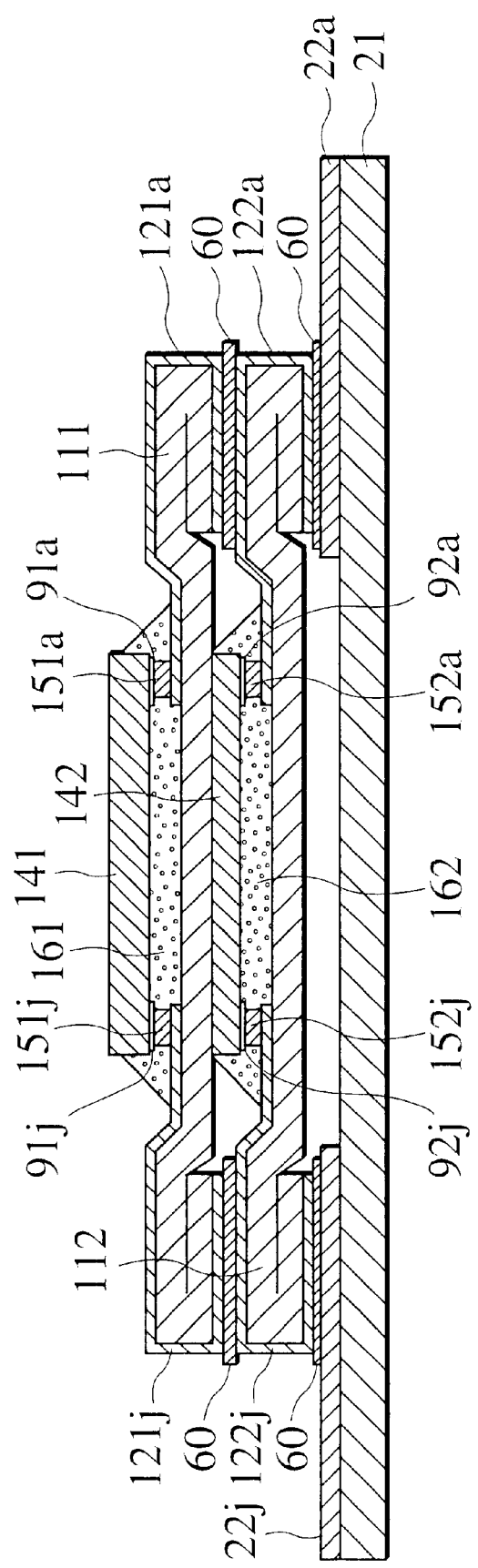

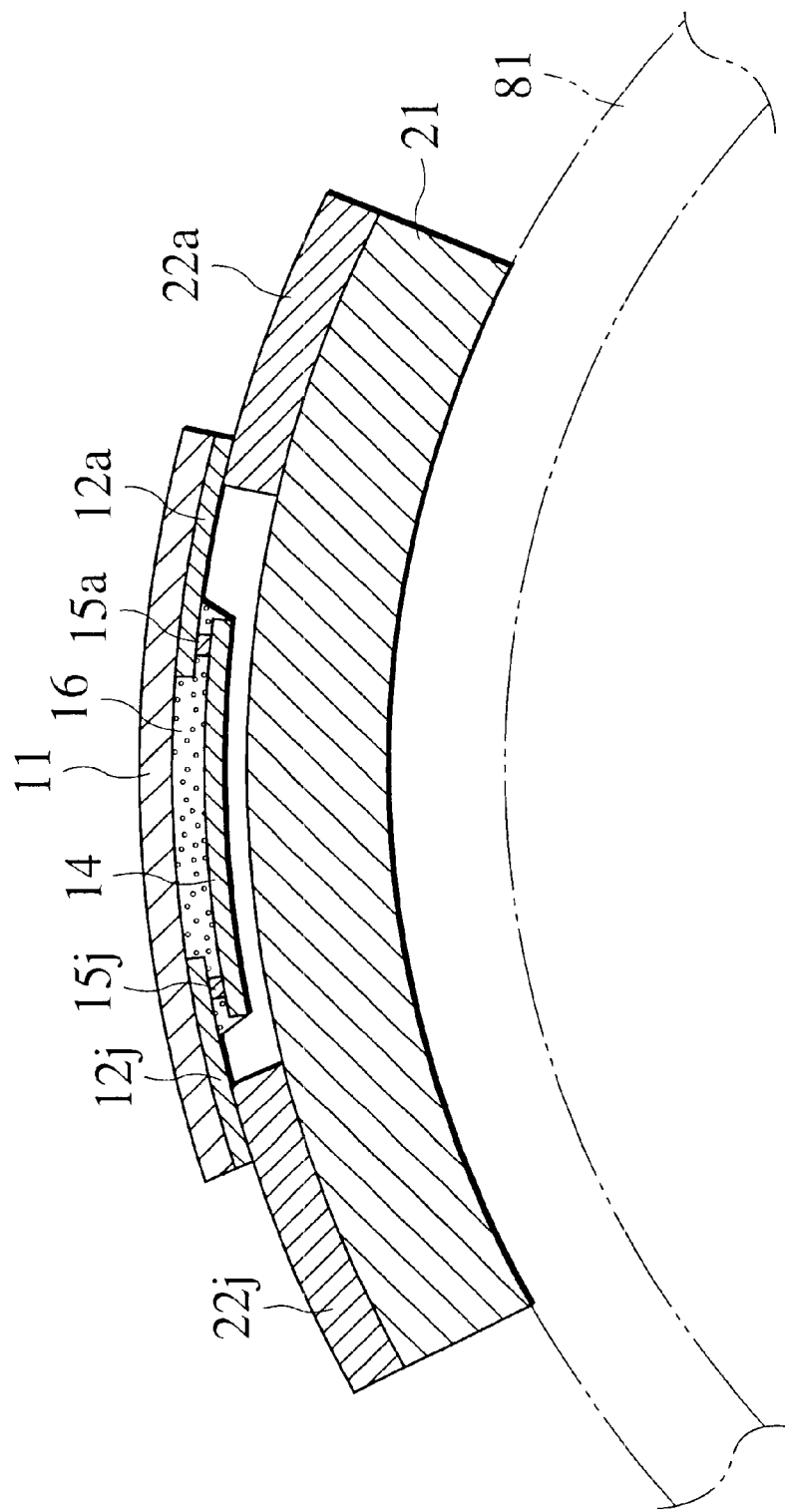

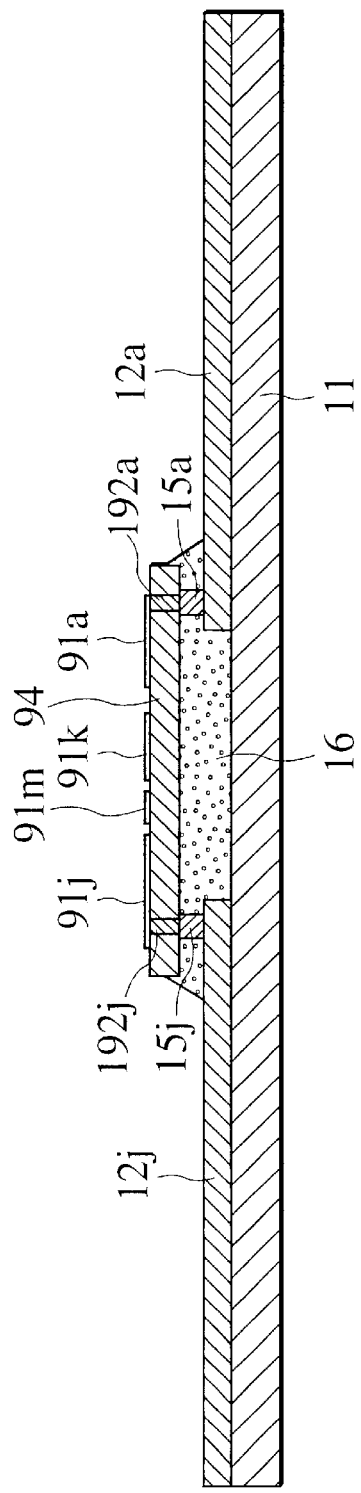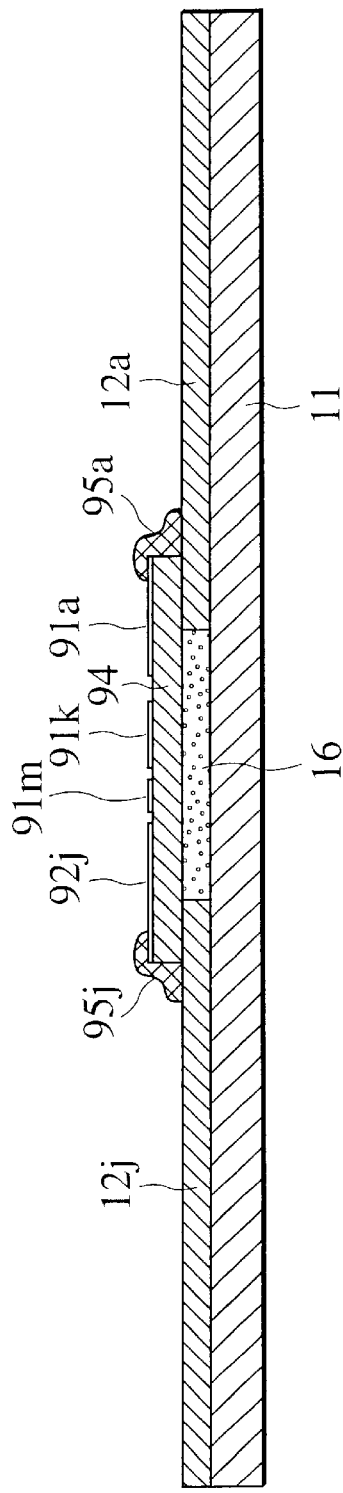

FLEXIBLE PACKAGE HAVING VERY THIN SEMICONDUCTOR CHIP, MODULE AND MULTI CHIP MODULE (MCM) ASSEMBLED BY THE PACKAGE, AND METHOD FOR MANUFACTURING THE SAME

BACKGROUND OF THE INVENTION

1. Field of the Invention

The present invention relates to a package for a semiconductor integrated circuit such as large scale integration (LSI), very large scale integration (VLSI), ultra large scale integration (ULSI) or gigascale integration (GSI), etc., a module in which the package is attached on a packaging substrate, a multi chip module (MCM) in which a plurality of semiconductor chips are mounted on the packaging substrate, and a method for manufacturing the module.

2. Description of the Related Art

FIG. 1 is a perspective view showing an example of a ball grid array (BGA) structure, partially cut away, of a semiconductor package being employed currently. In this BGA, a silicon chip 102 which has a thickness of 300 $\mu$m to 450 $\mu$m or more is mounted on a substrate 101 acting as "an interposer". Bonding pads disposed on perimeter of the silicon chip 102 are connected to another bonding pads disposed on a surface of the substrate 101 by bonding wires 103. Also, the bonding pads formed on the surface of the substrate 101 are connected electrically to solder balls 104 which are provided on a back surface side of the substrate 101, via through holes formed in the substrate 101. Then, a package is formed to have such a shape that the silicon chip 102 is covered with mold resin 105. Then, a module is constructed by connecting the silicon chip 102 to a packaging substrate via the solder balls 104. However, a thickness of the semiconductor package shown in FIG. 1 is considerably thick, such that the minimum thickness is about 1.2 mm. Therefore, the request for reducing the package thickness so as to reduce the geometrical size, weight, etc. of the mobile device, etc. in recent years has not been achieved.

Therefore, in order to greatly reduce the thickness of the semiconductor package, the respective thicknesses of constituent materials of the package were reduced. However, by simply reducing the thicknesses of constituent materials, the package warps further and product flatness cannot be assured. For example, in the case of the package of 0.12 mm thickness and a constituent material of molding resin, which has a Young's modulus of about 12 to 25 Gpa, the package warps a large amount, such as about 1.5 mm relative to a length of 20 mm. In addition, because the rigidity of the constituent material per se is high, the resin cracks due to the small displacement, causing product reliability to deteriorate.

SUMMARY OF THE INVENTION

The present invention has been made to overcome the existing problems as described above. Then it is an object of the present invention to provide a flexible package with lower rigidity, and also to assure flatness of the flexible package, by reducing the warpage of the flexible package, as a single product.

It is another object of the present invention to provide a flexible module that can reduce its overall thickness and have high packaging reliability, the module employing the flexible package.

It is still another object of the present invention to provide a flexible module which can be attached on a curved surface such as the side wall of a pipe, a motor, a pen etc. and also can have the lower rigidity and the high packaging reliability.

It is a yet still another object of the present invention to provide a MCM which can be assembled by laminating a plurality of semiconductor chips along the thickness direction and also can have the small overall thickness and the high packaging reliability.

It is a further object of the present invention to provide a method for manufacturing the module, which can assemble above-mentioned package easily and simply on a packaging substrate.

In order to achieve the above objects, a first feature of the present invention inheres in a flexible package, which has a low rigidity substrate (referred to as a "flexible substrate" hereinafter) and a low rigidity semiconductor chip (referred to as a "flexible semiconductor chip" hereinafter) mounted over the flexible substrate. On a principal surface of the flexible substrate, plurality of metal wirings are disposed. On a surface of flexible semiconductor chip, a plurality of bonding pads are disposed. The flexible package of the first feature further has joint metals for connecting electrically the plurality of bonding pads and the plurality of metal wirings respectively and a sealing member sandwiched between the flexible substrate and the flexible semiconductor chip.

According to the first feature of the present invention, the thickness of the semiconductor chip is reduced smaller than the normally-used thickness so as to reduce the rigidity of the chip. As the semiconductor chip, an element semiconductor such as silicon (Si), germanium (Ge), etc. or a compound semiconductor chip such as gallium arsenide (GaAs), gallium phosphide (GaP), indium phosphide (InP), silicon carbide (SiC), etc. may be employed. Further, the rigidity of the overall package can be reduced by reducing thicknesses of respective constituent parts of the package such as the flexible substrate, etc. Therefore, generation of the package crack due to displacement can be avoided. In addition, since the sealing member is sandwiched between the flexible substrate and the flexible semiconductor chip, the warpage of the package can be suppressed extremely small. Hence, flatness of the flexible package as a single product can be assured sufficiently. In particular, if the sealing member is composed of material having a low linear coefficient of thermal expansion (CTE), desired and normal flatness can be attained with the low rigidity structure. On the other hand, the flexible package can be attached onto the curved surface, employing the nature of the very low rigidity. And, such package is applicable to the IC card, etc. by utilizing the technical advantage that the package has a small thickness and has low rigidity.

A second feature of the present invention inheres in a flexible module having a packaging substrate, a flexible substrate disposed on the packaging substrate and a flexible semiconductor chip attached over the flexible substrate. On the principal surface of the packaging substrate, a plurality of packaging wirings are formed. The flexible substrate has a plurality of metal wirings connected electrically to the plurality of packaging wirings respectively, on a principal surface of the flexible substrate. The flexible module further has joint metals for connecting electrically the plurality of bonding pads and the plurality of metal wirings respectively. And a sealing member is sandwiched between the flexible substrate and the flexible semiconductor chip.

According to the second feature of the present invention, the flexible semiconductor chip which is formed thinner than the normally-used thickness so as to obtain the lower the rigidity. Further, since the thicknesses of respective constitute parts such as the flexible substrate, etc. are thinned, the rigidity of the overall module can be reduced. Therefore, even if stress is generated due to difference between the CTEs with the temperature history required for thermal process in the assembling stage, or due to the variation of the environment temperature in the usage stage, such stress can be relaxed. For example, since the linear CTEs of the packaging substrate and the semiconductor chip are largely different mutually, the packaging substrate is relatively expanded rather than the semiconductor chip at higher temperature. And, the packaging substrate is relatively contracted rather than the semiconductor chip at lower temperature. However, in the module according to the second feature of the present invention, since the thickness of the semiconductor chip is small, margin of the displacement in the vertical direction of the surface of the semiconductor chip is large. More particularly, since the semiconductor chip can displace freely in the vertical direction of the surface, the stress can be relaxed. Therefore, destruction of the inner structure caused by the temperature change is suppressed and thus the packaging reliability can be improved. As a result, the reliability as the product of the module can be assured. Also, since the sealing member is sandwiched between the flexible substrate and the flexible semiconductor chip, the warpage of the module can be reduced very small and thus the flatness as the single product can be maintained sufficiently.

Since the module according to the second feature of the present invention has the low rigidity structure, a mode in which the packaging substrate is so configured such that it has a curved surface can be achieved. Therefore, curved surface such as a pipe, etc. can be employed as an object to be attached. In addition, the module may be applied to the IC card, etc. by utilizing such merit that the module is formed thin and flexible.

A third feature of the present invention inheres in a MCM, which is at least constructed of a packaging substrate, first and second flexible packages. Each of the first and second flexible packages has a substantially same structure as already stated in the first feature of the present invention. On a principal surface of the packaging substrate, a plurality of packaging wirings are formed. The first flexible package has a first flexible substrate, a first flexible semiconductor chip attached over the principal surface of the first flexible substrate, and first joint metals connecting electrically the first flexible semiconductor chip and the first flexible substrate. The first flexible package further has a first sealing member sandwiched between the first flexible substrate and the first flexible semiconductor chip. On a principal surface of the first flexible substrate, a plurality of first metal wirings are disposed. And the first metal wirings are connected electrically to the plurality of packaging wirings respectively. The first flexible semiconductor chip has a plurality of first bonding pads on a surface of the first flexible semiconductor chip. The first joint metals connect electrically the plurality of first bonding pads and the plurality of first metal wirings respectively.

And the second flexible package further has a second flexible substrate, a second flexible semiconductor chip attached over the principal surface of the second flexible substrate, and second joint metals for connecting electrically the second flexible semiconductor chip and the second flexible substrate. The second flexible package further has a second sealing member sandwiched between the second flexible substrate and the second flexible semiconductor chip. On a principal surface of the second flexible substrate, a plurality of second metal wirings are disposed. The second metal wirings are connected electrically to the plurality of first metal wirings respectively. On a surface of the second flexible semiconductor chip, a plurality of second bonding pads are disposed. The second joint metals connects electrically the plurality of second bonding pads and the plurality of second metal wirings respectively.

According to the third feature of the present invention, a thickness necessary for a sheet of the semiconductor chip is reduced extremely so as to form the flexible semiconductor chip. And the respective constituent parts of the package such as the flexible substrate, etc. are also made thin. Therefore, by the stacked structure according to the third feature of the present invention, which is constructed by laminating a plurality of sheets of flexible semiconductor chips, the overall thickness of the MCM can be significantly reduced. Also, since the rigidity of respective semiconductor chips are made smaller, cracking, crazing, or damages, which might be caused by displacements due to differences in linear CTEs of the constituent parts, can be suppressed or avoided. As a result, the high packaging reliability as the product can be maintained.

A fourth feature of the present invention inheres in a method for manufacturing a module, which includes the steps of (a) reducing a thickness of a semiconductor chip into 10 $\mu$m to 150 $\mu$m; (b) delineating a plurality of packaging wirings on a principal surface of a packaging substrate; (c) delineating a plurality of metal wirings on a principal surface of a flexible substrate; (d) mounting the semiconductor chip over the principal surface of the flexible substrate; and (e) aligning the plurality of packaging wirings and the plurality of metal wirings, and then connecting electrically them mutually.

According to the fourth feature of the present invention, the module which has a small total thickness and has low rigidity and high packaging reliability can be manufactured easily, simply and at low cost so as to provide a high manufacturing yield.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF DRAWINGS

FIG. 3A is a graph showing relationships between thicknesses of silicon chips and amounts of deflection;

FIG. 5A is a sectional view showing a schematic structure of a module according to a variation of the first embodiment of the present invention;

FIGS. 5B and 5C are sectional views showing the deflection of the module according to the variation of the first embodiment, caused by the temperature change;

FIG. 6A is a sectional view showing a schematic structure of a module using a thick silicon chip as a comparative example;

FIGS. 6B and 6C are sectional views showing the deflection of the module shown in FIG. 6A, caused by the temperature change;

FIG. 10 is a sectional view showing a stacked structure of a MCM, according to a second embodiment of the present invention;

FIG. 13 is a sectional view showing structures of a flexible package and a module employing this package, according to a fourth embodiment of the present invention;

FIG. 14A is a sectional view showing a structure of a flexible package according to other embodiment of the present invention; and FIG. 14B is a sectional view showing a structure of a flexible package according to still other embodiment of the present invention.

DETAILED DESCRIPTION OF THE PREFERRED EMBODIMENTS

Figure 1:
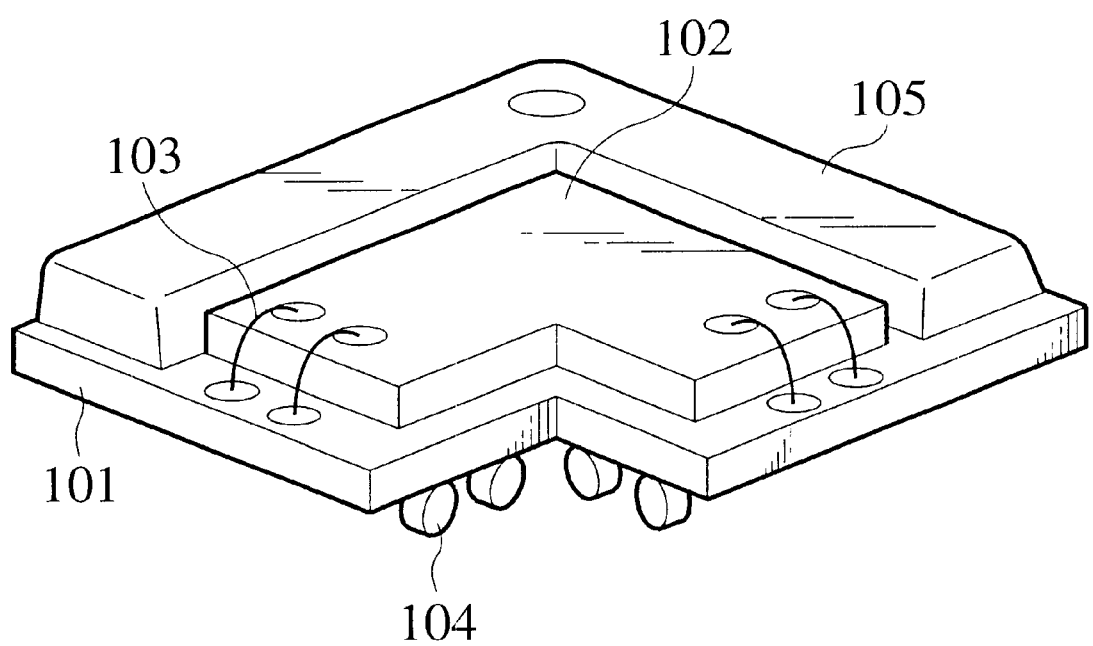
FIG. 1 is a perspective view showing an example of a structure, partially cut away, of a semiconductor package which is currently employed.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices and packages, it will be appreciated that the various drawings are not drawn to scale from one figure to another nor inside a given figure, and in particular that the layer thicknesses are arbitrarily drawn for facilitating the reading of the drawings. In the following description, numerous specific details are set fourth such as specific thickness values, etc. to provide a through understanding of the present invention. However, it will be obvious to those skilled in the art that the present invention may be practiced without such specific details.

(First Embodiment)

Figure 2A:
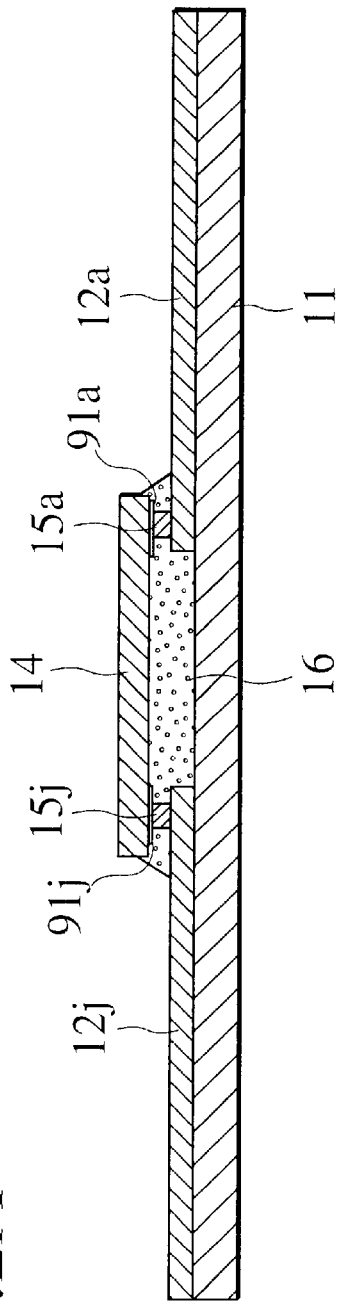
FIG. 2A is a sectional view showing a view of a flexible package according to a first embodiment of the present invention.

As shown in FIG. 2A, a flexible package according to a first embodiment of the present invention has a flexible substrate 11 on a principal surface of which a plurality of metal wirings 12a, . . . , 12j, . . . are formed; a flexible semiconductor chip 14 attached over the flexible substrate 11 and having a plurality of bonding pads 91a, . . . ,91j, . . . ; joint metals 15a, . . . , 15j, . . . for connecting electrically a plurality of pads and a plurality of metal wirings respectively; and a sealing member 16 filled between the flexible substrate 11 and the flexible semiconductor chip 14.

The metal wirings are formed on the flexible substrate 11 as a plurality of radially-extending aluminum (Al) wirings 12a, . . . , 12j, . . . Each thickness of the Al wirings 12a, . . . , 12j, . . . is 9 µm, for example. It is preferable that the flexible substrate 11 should be formed of an organic substrate. In the first embodiment of the present invention, polyethylene terephthalate (PET) material is employed as the flexible substrate 11. The modulus of elasticity, or Young's modulus of PET is 0.25 Gpa. It is preferable that a thickness of the flexible substrate (PET substrate) 11 should be set to 10 to 50 µm. In FIG. 2A, the thickness is set to 38 µm, for example. The lower rigidity is intended by reducing the thickness of the flexible substrate (PET substrate) 11. Also, a silicon chip 14 is employed as the flexible semiconductor chip 14, and disposed in a face down orientation over the flexible substrate (PET substrate) 1. A thickness of the silicon chip 14 is selected as thin as possible such as 10 µm to 150 µm, e.g., 50 µm (its manufacturing method will be described later) so as to obtain the low rigidity. Then, a bump 15a as "the joint metal", using a high conductive material such as gold (Au) is arranged on the Al wiring 12a which is formed on the principal surface of the flexible substrate (PET substrate) 11, . . . , a gold (Au) bump 15j is arranged on the Al wiring 12j . . . Bonding pads 91a, . . . , 91j, . . . formed of metal thin films such as aluminum (Al) films, or aluminum alloy (Al—Si, Al—Cu—Si) films etc. are regularly arranged on perimeter of a surface of the silicon chip 14. The locations of the bonding pads 91a, . . . , 91j, . . . correspond to the positions of the gold (Au) bumps 15a, . . . , 15j, . . . Then, the Al wiring 12a and the corresponding bonding pad 91a on the silicon chip 14 are joined to each other via the gold (Au) bump 15a, . . . , the Al wiring 12j and the corresponding bonding pad 91j on the silicon chip 14 are joined to each other via the gold (Au) bump 15j, . . . , whereby a flip-chip structure can be constructed. Each thickness of the gold (Au) bumps 15a, . . . , 15j, . . . is 20 µm, for example. Then, in order to protect the surface of the silicon chip 14 containing these bump-joint portions, such surface of the silicon chip 14 is sealed with an underfill 16 formed of material which has a linear CTE α=0.01 to 30 ppm/°C. More particularly, for example, the underfill 16 formed of an "anisotropic conductive resin" which has a linear CTE α=0.1 to 15 ppm/°C., etc. is employed as the sealing member. The "anisotropic conductive film (ACF)" is a polymer film dispersed with metallic particles so that sufficient metallic particles are present to only allow conduction perpendicular to the plane of the substrate surface. In other word, the polymer film only conducts current in a direction perpendicular to the plane of the substrate surface. Commonly used metallic particles in the ACF include gold (Au), silver (Ag), and nickel (Ni).

Figure 2B:
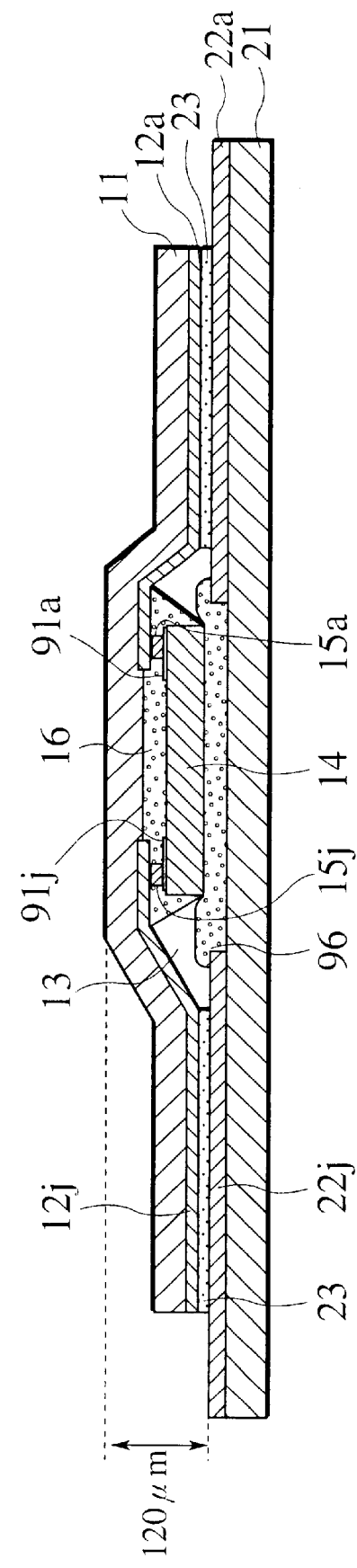
FIG. 2B is a sectional view showing a schematic structure of a module according to the first embodiment of the present invention.

FIG. 2B is a sectional view showing a structure of the module according to the first embodiment of the present invention, in which the flexible package shown in FIG. 2A is mounted on the packaging substrate. By deforming the flexible substrate (PET substrate) 11A, a cavity 13 into which the silicon chip 14 is installed is formed in a central portion of the flexible substrate (PET substrate) 11. A plurality of radially-extending packaging wirings 22a, ..., 22j, ..., each has a thickness of 18 µm to 22 µm, are arranged on a principal surface of a packaging substrate 21 such as a printed wiring board (PWB), a flexible printed circuit board (FPC), etc. Then, the Al wiring 12a on the principal surface of the flexible substrate (PET substrate) 11 and the packaging wiring 22a on the packaging substrate 21 are joined to each other via conductive adhesive layer 23, ..., the Al wiring 12j and the packaging wiring 22j are joined to each other via the conductive adhesive layer 23, ..., whereby the module according to the first embodiment of the present invention can be constructed.

In the module according to the first embodiment of the present invention having such structure, as shown in FIG. 2B, a thickness from the uppermost end of the flexible substrate (PET substrate) 11 to the top surface of the packaging wirings 22 becomes about 120 µm, for example. Thus, the module having the thinness and the packaging reliability, both are not provided by the currently employed package, can be achieved.

Then, since the Al wirings 12a, ..., 12j, ... on the flexible substrate (PET substrate) 11 and the flexible silicon chip 14 formed as the extremely thin film are connected by the flip chip technology via the Au bumps 15a, ..., 15j, ..., it is possible to greatly reduce warping of the package. The resin 16 may be sandwiched between the silicon chip 14 and the flexible substrate (PET substrate) 11. Also, the resin, such as a solder resist film 96, etc. may be sandwiched between the silicon chip 14 and the principal surface of the packaging substrate 21. More particularly, as described above, the large warping, such as about 1.5 mm occurs relative to the length of 20 mm in the module shown in FIG. 1, can be suppressed into about 0.15 mm relative to the length of 17 mm in the module according to the first embodiment of the present invention.

Figure 3B:
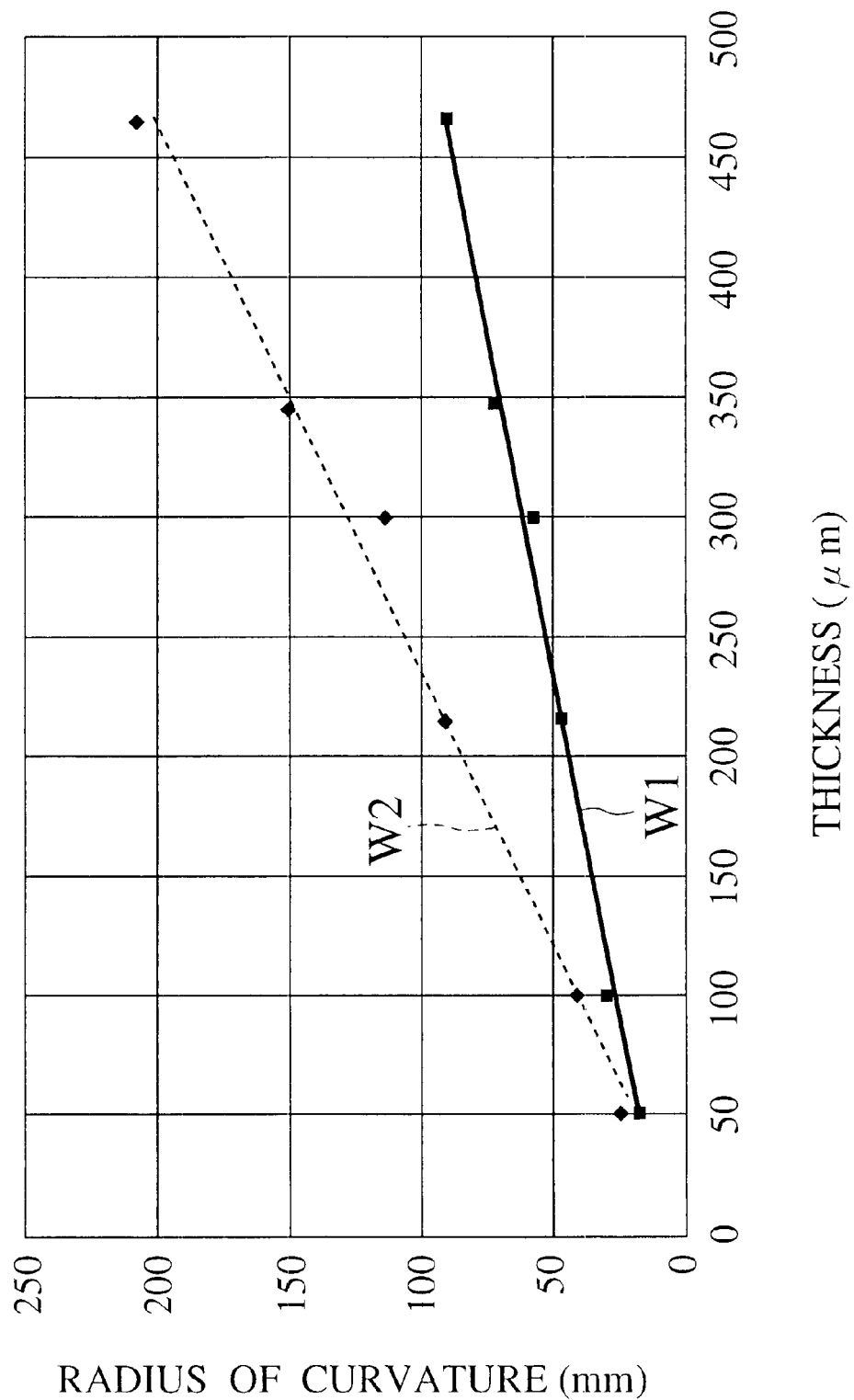
FIG. 3B is a graph showing relationships between the thicknesses of the silicon chips and radii of curvature.

The normal thickness of the commercially available wafer, although depending upon the wafer diameters, is about 450 µm to 1 mm. For example, the 6 inch wafer has the thickness of about 600 µm to 650 µm. The thickness of the wafer is increased according to the increase of the wafer diameter. It is preferable that the thickness of the silicon chip 14, which is employed in the module according to the first embodiment, should be reduced as thin as possible rather than the normal thickness of the commercially available wafer. An amount of deflection of the silicon chip 14 until the silicon chip 14 is fractured can be increased by the first embodiment, which employs extremely reduced thickness of the silicon chip 14. In other words, the minimum radius of curvature caused by the deflection of the silicon chip 14, at which the silicon chip 14 is broken, can be reduced by the art with extremely reduced thickness of the silicon chip 14 so as to make the silicon chip 14 flexible. Experimental results indicating such effect are shown in FIGS. 3A and 3B.

Figure 4A:
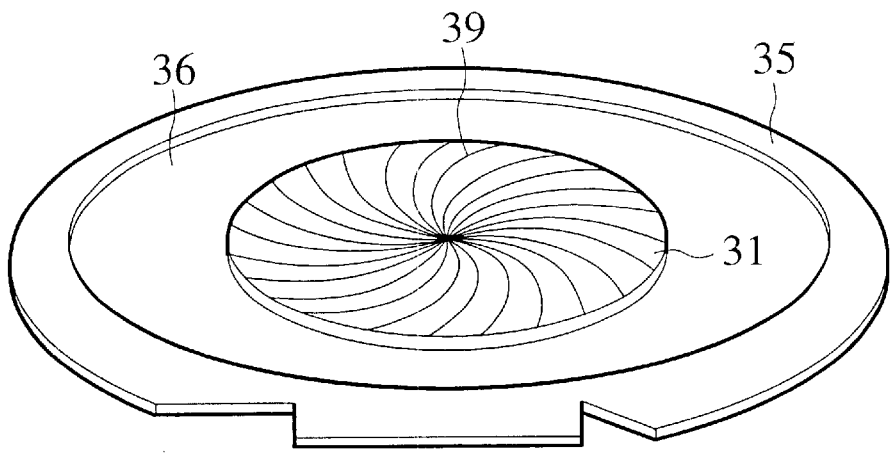
FIG. 4A is a view showing grinding traces formed on a back surface of the silicon chip.
Figure 4B:
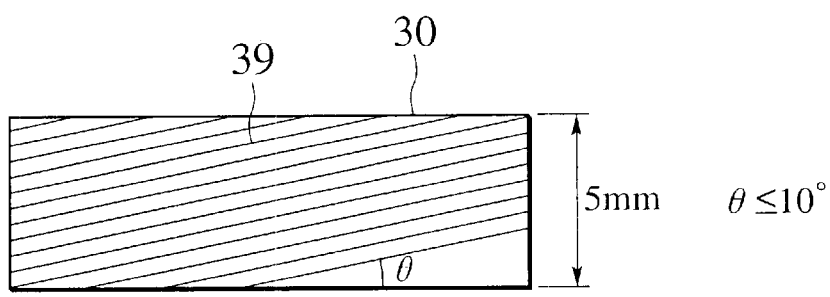
FIG. 4B is a view showing a sample having a grinding trace angle of $\theta \leq 10°$.
Figure 4C:
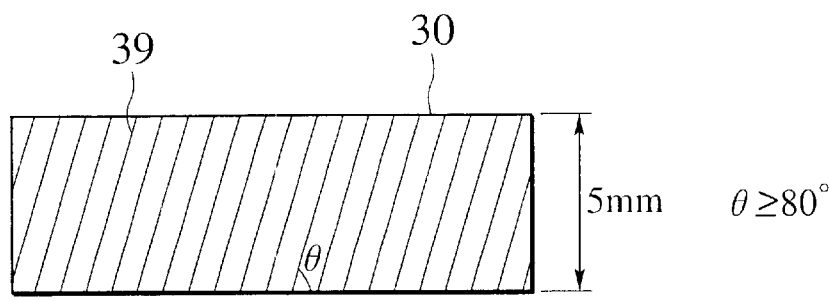
FIG. 4C is a view showing a sample having a grinding trace angle of θ≧80°.

FIG. 3A is a graph showing a relationship between the thickness of the silicon chip and an amount of the deflection when the break-down test is performed by using samples 30, 30, 30, ... formed of the strip-like silicon chips, as shown in FIGS. 4B and 4C. Each of the samples 30, 30, 30 ... has a width of 5 mm and a predetermined length. In this break-down test, a measuring jig having edges acting as two fulcrums is prepared. A distance between two fulcrums is set to be 5 mm. The longitudinal direction of the strip-like silicon chip 30 is selected and arranged to extend over the two edges acting as the fulcrums, and then the deflections are measured by applying the breaking pressures to center portions between two fulcrums.

When the thickness of the silicon wafer 31 is made thin by grinding, radial circular-arc-like traces, or the "grinding traces" 39 are formed on an overall back surface of the silicon wafer 31, as shown in FIG. 4A. Such grinding is performed after the silicon wafer 31 is stuck to a surface protection tape 36 to be secured thereto, as shown in FIG. 4A. The silicon wafer 31 is stuck onto the surface protection tape 36 to be secured after the surface protection tape 36 is adhered to a flat ring 35 and then wrinkles, etc. of the surface protection tape 36 are removed.

In the limited area of the strip-like silicon chip as the test sample having a width of 5 mm, n shown in FIGS. 4B and 4C, the grinding traces 39, more precisely, tangents of respective grinding traces 39 can be approximated as a pattern consisting of a plurality of substantially parallel lines. Therefore, in the present invention, an angle of the tangents of the parallel grinding traces 39 in the neighborhood of a long side of the sample relative to the long side of the sample is defined as a "grinding trace angle". A curve "P1" in FIG. 3A indicates the result of the sample formed of the silicon chip having the grinding trace angle of $\theta \leq 10°$, as shown in FIG. 4B. Also, a curve "P2" in FIG. 3A indicates the result of the sample formed of the silicon chip having the grinding trace angle of $\theta \geq 80°$, as shown in FIG. 4C. It can be understood that the sample, which is cut out along the direction to give the grinding trace angle of $\theta \leq 10°$, as shown in FIG. 4B, has the larger amount of deflection than the sample, which is cut out along the direction to give the grinding trace angle of $\theta \geq 80°$, as shown in FIG. 4C, and thus is strong in breaking strength. Therefore, in the first embodiment, it is preferable that the silicon chip which is cut out along the direction to give the grinding trace angle of $\theta \leq 10°$ should be employed as the flexible semiconductor chip 14.

In other words, the long sides of the test sample indicating the curve "P1" and the test sample indicating the curve "P2" in FIG. 3A are set to intersect substantially orthogonally with each other. As apparent from FIG. 3A, the amounts of the deflection to come up to the break-down point become larger and larger as the wafer thickness becomes thinner and thinner.

FIG. 3B is a graph showing relationships between the thicknesses of the silicon chips and the radii of curvature. Like FIG. 3A, the measured result of the silicon chips, each having a width of 5 mm is shown. A curve "W1" in FIG. 3B indicates the result of the samples having the grinding trace angle of $\theta \leq 10°$ shown in FIG. 4B, and a curve "W2" indicates the result of the samples having the grinding trace angle of $\theta \geq 80°$ shown in FIG. 4C. As apparent from FIG. 3B, it can be seen that, as the thickness of the silicon chip is reduced much more, the radius of curvature of the deflection (warping) of the silicon chip to reach the breakdown of the silicon chip can be made small and thus the flexibility can be increased. It can be seen that the sample W1, which is cut out along the direction to give the grinding trace angle of $\theta \leq 10°$ has the smaller radius of curvature of the deflection of the silicon chip than the sample W2, which is cut out along the direction to give the grinding trace angle of $\theta \geq 80$ and thus has the strong breakdown resistance. Also, it can be seen from the result shown in FIG. 3B that, in the first embodiment, preferably the silicon chip which is cut out along the direction to give the grinding trace angle of $\theta \leq 10°$ should be employed as the flexible semiconductor chip 14.

In the first embodiment, the silicon chip 14 of 50 µm thickness is explained as an example. However, if the silicon chip 14 has the thickness of about 10 µm to 150 µm, the similar advantages can be achieved. In particular, it is preferable that the thickness is set to about 30 μm to 100 μm. Since it becomes difficult to handle the silicon chip 14 if the thickness is reduced lower than 30 μm, such thickness may not become a reasonable thickness in the industrial aspect.

FIG. 5A is a sectional view showing a structure of a flexible package and a module using such package according to a variation of the first embodiment at room temperature. As shown in FIG. 5A, the flexible package according to the variation of the first embodiment is constructed by a flexible substrate 11, a silicon chip 14 mounted on the flexible substrate 11, on the principal surface of the flexible substrate 11 a plurality of radially-extending aluminum (Al) wirings 12a, . . . , 12j, . . . are arranged. Then, the gold (Au) bump 15a is arranged on the Al wiring 12a, and the gold (Au) bump 15j is arranged on the Al wiring 12j. The bonding pads formed of a metal thin film such as an aluminum (Al) film, etc. are arranged on perimeter of the surface of the silicon chip 14. The locations of the bonding pads correspond to the positions of the gold (Au) bumps 15a, . . . , 15j, . . . , . Then, the Al wiring 12a and the corresponding bonding pad on the silicon chip 14 are joined to each other via the gold (Au) bump 15a, . . . , the Al wiring 12j and the corresponding bonding pad on the silicon chip 14 are joined to each other via the gold (Au) bump 15j, . . . , whereby the flip-chip structure can be constructed. The thickness of the silicon chip 14 is formed smaller than 150 μm. Then, in order to protect the surface of the silicon chip 14 containing these bump-joint portions, such surface of the silicon chip 14 is sealed with the underfill 16. Through holes (vias) passing through the flexible substrate 11 are provided in peripheral portions of the flexible substrate 11. Buried joint metals 19a, . . . , 19j, . . . are provided, embedding the metals into the through holes. The buried joint metals 19a, . . . , 19j, . . . are connected to the Al wirings 12a, . . . , 12j, . . . on the principal surface of the flexible substrate (PET substrate) 11 respectively.

Meanwhile, packaging wirings 22a, . . . , 22d, 22e, 22f, 22g, . . . , 22j, . . . are arranged on the principal surface of the packaging substrate 21. Then, the buried joint metals 19a, . . . , 19j, . . . which are buried in the flexible substrate 11 and the packaging wirings 22a, . . . , 22d, 22e, 22f, 22g, . . . , 22j, . . . are connected to each other via solder balls 104a, . . . , 104d, 104e, 104f, 104g, . . . , 104j, . . . .

FIGS. 5B and 5C are sectional views showing the deflection of the same module already shown in FIG. 5A, according to the variation of the first embodiment, the deflection is caused by the temperature change. FIG. 5B shows schematically the deflections of the silicon chip 14, the flexible substrate 11, the packaging substrate 21, etc. caused at a high temperature of 125° C. FIG. 5C shows schematically the deflections of the silicon chip 14, the flexible substrate 11, the packaging substrate 21, etc. caused at a low temperature of −55° C. The packaging substrate 21 has a linear CTE $\alpha_{MB}$=15 to 18 ppm/°C. which is largely different from a linear CTE $\alpha_{Si}$=3.5 ppm/°C. of silicon. However, in the module according to the variation of the first embodiment, since the thickness of the silicon chip 14 is small, margin of the displacement in the vertical direction of the surface of the silicon chip 14 is large. More particularly, since the silicon chip 14 can displace freely in the vertical direction of the surface, stress applied to the solder balls 104a, . . . , 104d, 104e, 104f, 104g, . . . , 104j, . . . can be relaxed even if the packaging substrate 21 is relatively expanded (125° C.) and contracted (−55° C.) relative to the silicon chip 14 by the temperature change. Accordingly, the solder balls 104a, . . . , 104d, 104e, 104f, 104g, . . . , 104j, . . . are hard to be destroyed by the stress, ascribable to the temperature change, and thus the packaging reliability can be improved.

FIG. 6A is a sectional view showing a schematic structure of a comparative example against the module shown in FIG. 5A. This comparative example is different from the module shown in FIG. 5A in that the thick silicon chip having a thickness of 300 μm is employed, but remaining structures are common to the module shown in FIG. 5A. FIGS. 6B and 6C are sectional views showing the deflection of the module according to the comparative example shown in FIG. 6A, at corresponding ambient temperatures. That is, FIG. 6B shows schematically the deflections of the silicon chip 14, the flexible substrate 11, the packaging substrate 21, etc. caused at the high temperature of 125° C. FIG. 6C shows schematically the deflections of the silicon chip 14, the flexible substrate 11, the packaging substrate 21, etc. caused at the low temperature of −55° C. In the module according to this comparative example, since the thickness of the silicon chip 14 is large, the margin of the displacement in the vertical direction of the surface of the silicon chip 14 is small and thus is rigid. Therefore, unlike the cases shown in FIGS. 5B and 5C, since the silicon chip 14 can not easily displace in the vertical direction of the surface, the large stress are generated between the solder balls 104a, . . . , 104d, 104e, 104f, 104g, . . . , 104j, . . . and the buried joint metals 19a, . . . , 19j, . . . , when the packaging substrate 21 is relatively expanded (125° C.) and contracted (−55° C.) relative to the silicon chip 14 by the temperature change. Further, the large stress are generated between the solder balls 104a, . . . , 104d, 104e, 104f, 104g, . . . , 104j, . . . and the packaging wirings 22a, . . . , 22d, 22e, 22f, 22g, . . . , 22j, . . . when the packaging substrate 21 is set at 125° C. or −55° C. Also, the large stress is generated in the solder balls 104a, . . . , 104d, 104e, 104f, 104g, . . . , 104j, . . . themselves, and thus the solder balls are brought into the destruction, since the solder balls are brittle and noncompliant.

Figure 7:
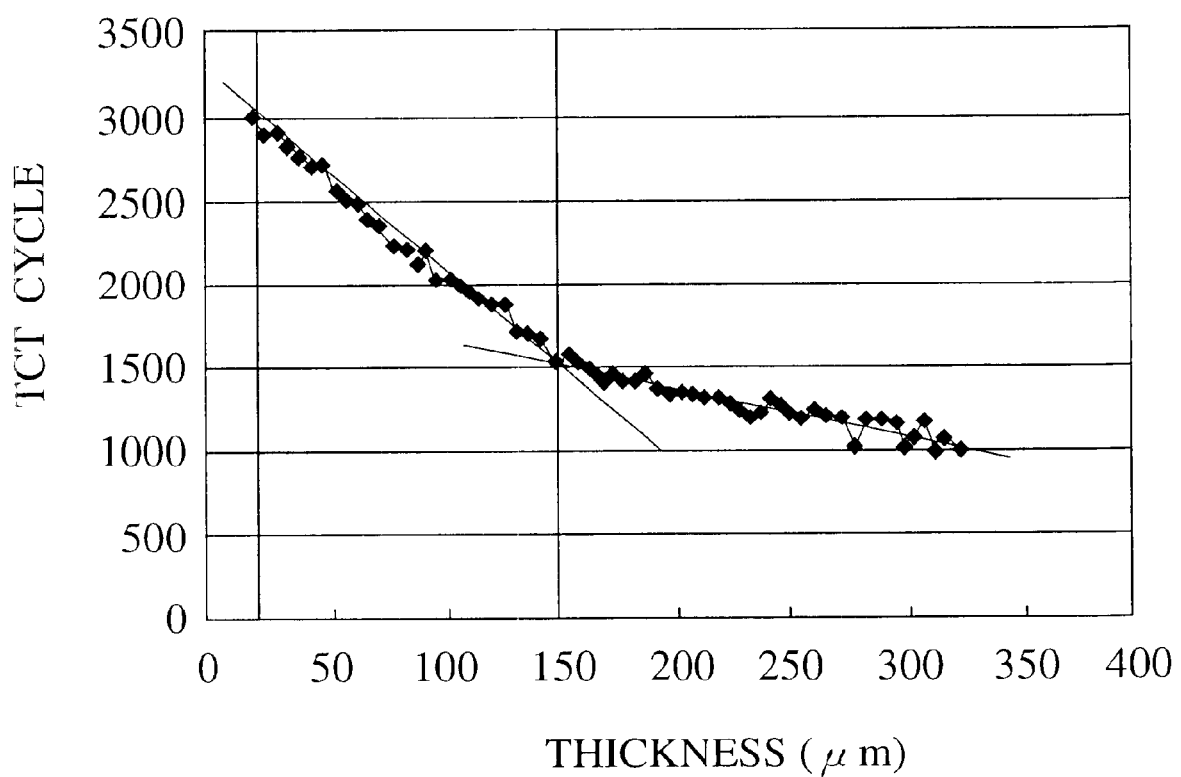
FIG. 7 is a graph showing a relationship between thicknesses of the silicon chips and TCT reliabilities.

FIG. 7 is a graph showing relationships between the thicknesses of the silicon chips and the temperature cycling test (TCT) reliabilities of the modules. It can be seen that the TCT reliabilities of the modules are increased as the thicknesses of the silicon chip are reduced. Also, it can be seen that a gradient indicating a proportional relationship between the thicknesses of the silicon chip and the TCT reliabilities of the modules is drastically changed at the thickness of the silicon chip of 150 μm. More particularly, it can be understood that the TCT reliabilities of the modules are not remarkably changed in the range of the thicknesses of the silicon chip of 150 μm or more even if the thicknesses of the silicon chips are changed, but the TCT reliabilities can be remarkably improved in the range of the thicknesses of the silicon chips of 150 μm or less if the thicknesses of the silicon chips are reduced. That is, it can be understood that the thickness of the silicon chip of 150 μm gives an inflection point in the relationship between the thicknesses of the silicon chips and the TCT reliabilities of the modules, as shown in FIG. 7. Then we can understand that the thickness of the silicon chip of 150 μm gives an important turning point of the failure mechanisms of the semiconductor modules.

Next, a method of manufacturing the module according to the first embodiment will be explained hereunder.

Figure 8A:
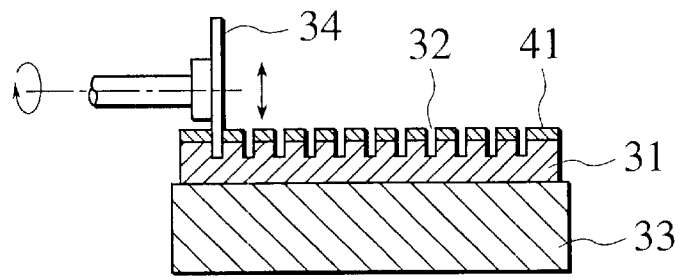
FIGS. 8A to 8H are sectional views showing steps of a method for manufacturing the module according to the first embodiment of the present invention.

(a) First, predetermined patterns of semiconductor integrated circuits are formed on the surface of the silicon wafer 31 by predetermined photolithography step, chemical vapor deposition (CVD) step, oxidation step, ion-implantation step, etching step, etc. Then, a passivation film such as a PSG film, a BPSG film, a silicon nitride film ($Si_3N_4$ film), or the like is deposited on the whole surface of the silicon wafer 31. That is, patterns of the semiconductor integrated circuits, with a predetermined exposure area (or chip area), are formed periodically on the surface of the silicon wafer 31 by the step and repeat methodology by stepper machine. Areas formed between the patterns of the chip area are used as dicing lane respectively. Then, as shown in FIG. 8A, the silicon wafer 31 on which the LSI patterns are formed is secured to a working table 33 of the dicing apparatus by the predetermined manner such that the LSI pattern-formed-surface 41 side of the semiconductor integrated circuits is facing upward. For example, the silicon wafer 31 is sucked and secured by the vacuum chuck. Then, matrix-like trenches 32 which are deeper than the chip thickness (e.g., 50 $\mu$m) of the flexible package according to the first embodiment by at least about 5 $\mu$m are formed by rotating a dicing blade 34 along the dicing lane.

Figure 8B:
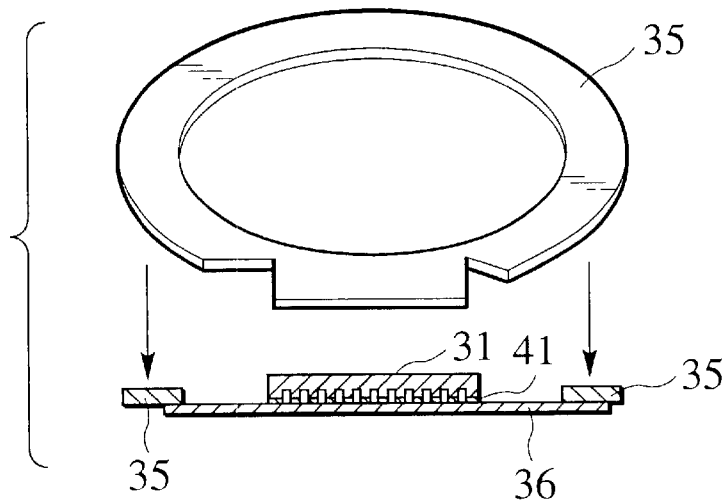

(b) Then, as shown in FIG. 8B, the flat ring 35 is stuck onto the surface protection tape 36 made of polyolefin having thickness of 110 $\mu$m. On the polyolefin film an acrylic adhesive layer having thickness of 50 $\mu$m is coated. Then, the wrinkles, etc. of the surface protection tape 36 are removed by the flat ring 35. And then, the LSI pattern forming surface 41 of the silicon wafer 31, at which the matrix-like trenches 32 are formed, is stuck onto the acrylic adhesive layer side of the surface protection tape 36 to secure thereto.

Figure 8C:
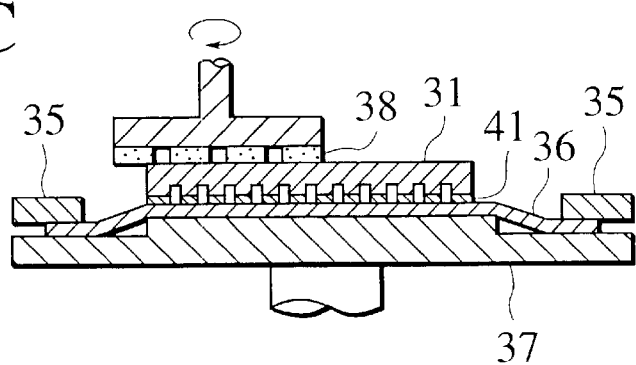

(c) Then, for example, using the infield grinding method grinds the back surface of the silicon wafer 31. That is, as shown in FIG. 8C, the silicon wafer 31 which is held by the flat ring 35 and the surface protection tape 36 is sucked and secured onto the working table 37 of the grinding machine. Then, the back surface of the silicon wafer 31 is ground while pushing a grindstone 38 against the back surface. At this time, the back surface (polished surface) of the silicon wafer 31 is ground by rotating the working table 37 and the grindstone 38 respectively to reach the trenches 32. When the polished surface reaches the bottoms of the trenches 32, the silicon wafer 31 can be automatically divided into individual chips. A depth of this grinding is set in view of the thickness (e.g., 50 $\mu$m) of the finished silicon chip 31.

Figure 8D:
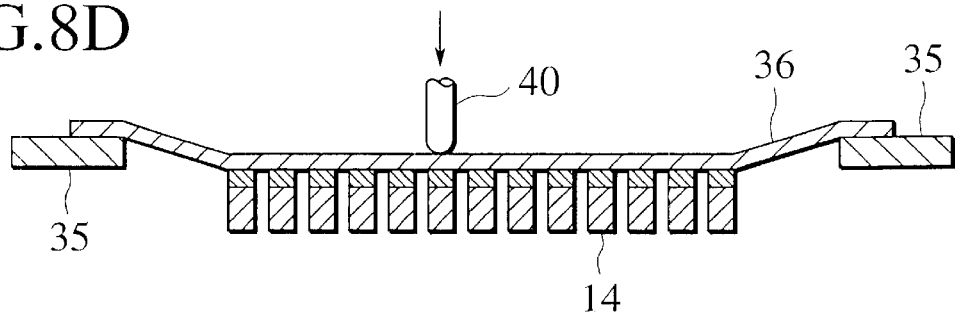

(d) Then, as shown in FIG. 8D, the flat ring to which individual divided silicon chips 14 are adhered and secured is installed onto the die bonding apparatus. Then, the pressure is applied downward to the LSI pattern forming surface 32 by using a tool 40 such as a pick-up needle, etc. via the surface protection tape 36. At that time, the silicon chips 14 can be stripped from the surface protection tape 36. In this manner, the flexible silicon chips 14 having the small thickness of 50 $\mu$m, for example, can be completed.

Figure 8E:
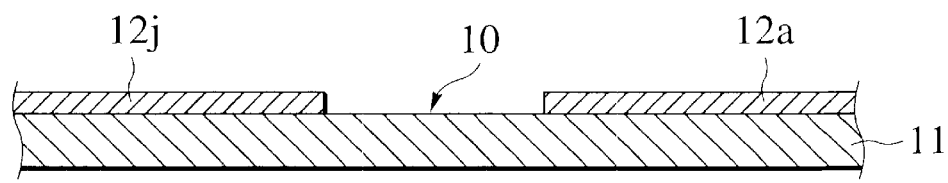

(e) Then, the thin continuous tape-like PET substrate 11 having the thickness of 38 $\mu$m, for example, is prepared as the flexible substrate. Then, on the flexible substrate an adhesive layer is coated. Next, the Al thin film of about 9 $\mu$m thickness is laminated on the overall principal surface of the continuous tape-like PET substrate 11 via the adhesive layer. Then, as shown in FIG. 8E, a plurality of radially-extending Al wirings 12a, ..., 12j, ... are delineated on the principal surface of the continuous tape-like flexible substrate 11, by selectively removing the Al thin film by virtue of the selective etching method. Such patterning of the Al wirings 12a, ..., 12j, ... may be conducted by known photolithography method after coating a photoresist film on the Al thin film. And the photoresist film is exposed with light passing through transparent parts of the predetermined mask, developed, rinsed and dried so as to form etching mask. And using this etching mask the Al thin film is selectively etched to form the required patterng of the Al wirings 12a, ..., 12j, ... Or, the patterning of the Al wirings 12a, ..., 12j, ... may be obtained by using the known screen printing method. Any way, opening portions 10, from which the PET substrate 11 is exposed, are formed periodically at predetermined locations on the principal surface of the continuous tape-like flexible substrate 11. The opening portions 10 are scheduled for mounting the flexible silicon chips 14, and are configured as rectangular window portions, respectively.

Figure 8F:
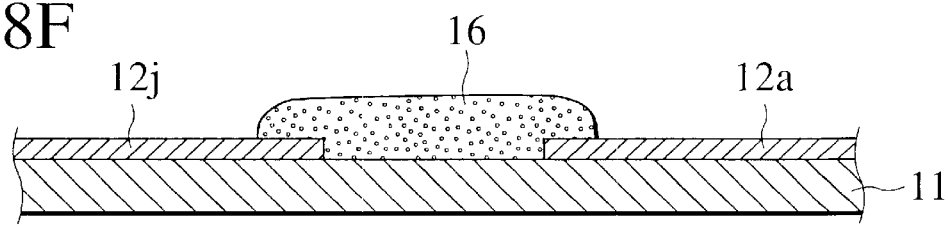

(f) Then, as shown in FIG. 8F, an "anisotropic conductive resin (ACR)" (or ACF) 16 serving as the underfill is coated in respective chip-mounting opening portions 10 by the potting method, etc. The "anisotropic conductive film (ACF)" is a polymer dispersed with metallic particles so that sufficient metallic particles are present to only allow conduction perpendicular to the plane of the substrate surface. Commonly used metallic particles include gold (Au), silver (Ag), and nickel (Ni).

Figure 8G:
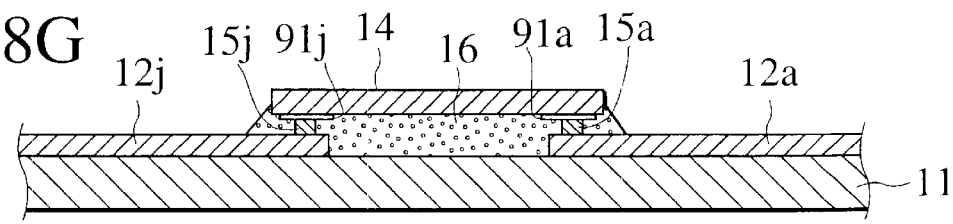
Figure 8H:
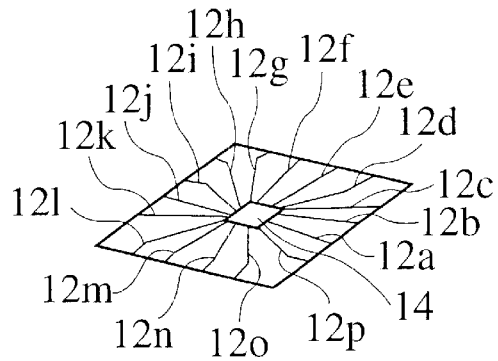

(g) In turn, as shown in FIG. 8G, the Al wirings 12a, ..., 12j, ... on the PET substrate 11 side are aligned with the Au bumps 15a, ..., 15j, ... on the silicon chips 14 side. Bonding pads 91a, ... 91j, ... formed on the silicon chips 14 mate with the Au bumps 15a, ..., 15j, ... And then, the silicon chips 14 are mounted on the PET substrate 11. Then, the silicon chips 14 are secured onto the PET substrate 11 by melting the connecting resin by heating it to about 120° C. and then curing the connecting resin. At this stage, the plurality of silicon chips 14 are mounted in the opening portions 10 which are arranged periodically on the continuous tape-like PET substrate 11 respectively, and thus a plurality of packages are formed successively. Then, as shown in FIG. 8H, individual flexible packages are cut down accordingly. In FIG. 8H, a pattern consisting of sixteen radially-extending Al wirings 12a, 12b, 12c, ..., 12j, ..., 12o, 12p delineated on one of the flexible packages is shown.

(h) Meanwhile, the packaging substrate 21 is prepared separately, and then a plurality of radially-extending packaging wirings 22a, ..., 22j, ... are delineated on the principal surface of the packaging substrate 21 by the selective etching method, the screen printing method, or the like. Then, the conductive adhesive layer 23 such as silver-filled epoxy is coated on the packaging wirings 22a, ..., 22j, ... For another example, the ACF, or the ACP, etc. may be employed as the conductive adhesive layer 23. Then, the Al wirings 12a, ..., 12j, ... of the PET substrate 11 are aligned, and mated with the packaging wirings 22a, ..., 22j, ..., and then the flexible package is mounted on the packaging substrate 21. In this state, the PET substrate 11 is secured onto the packaging substrate 21 by melting the conductive adhesive layer 23, by heating it up to a predetermined temperature, and then curing the conductive adhesive layer 23. Accordingly, the thin module shown in FIG. 2B according to the first embodiment can be completed.

Also, packaging of the flexible package according to the first embodiment onto the packaging substrate 21 can be implemented according to other methods. For instance, the "inter-leads joint method" may be employed in place of the method using the above conductive adhesive layer 23.

Figure 9A:
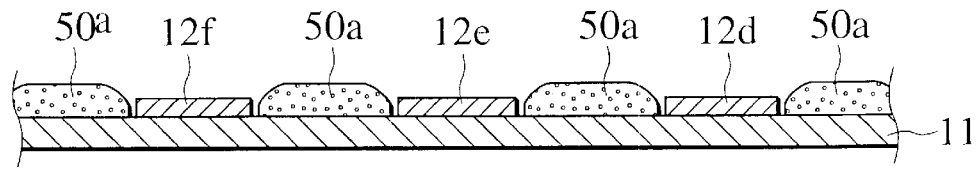
FIGS. 9A to 9D are sectional view showing steps of a "inter-leads joint method" of the flexible package, as a variation of the first embodiment of the present invention.

(i) That is, as shown in FIG. 9A, first adhesive layer 50a is selectively coated on parts in which the PET substrate 11 is exposed between the Al wirings 12d, 12e, 12f on the PET substrate 11 side.

Figure 9B:
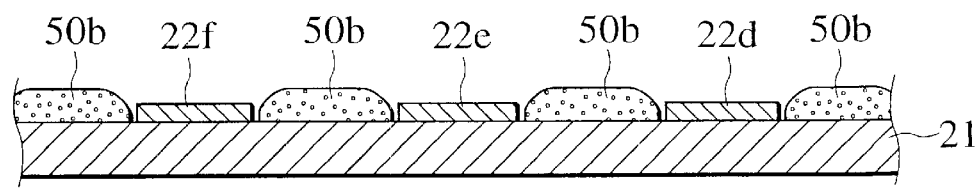

(ii) Similarly, as shown in FIG. 9B, second adhesive layer 50b is selectively coated on parts in which the packaging substrate 21 is exposed between the packaging wirings 22d, 22e, 22f on the packaging substrate 21 side. The same type adhesive layer as the first adhesive layer 50a may be employed as the second adhesive layer 50b.

Figure 9C:
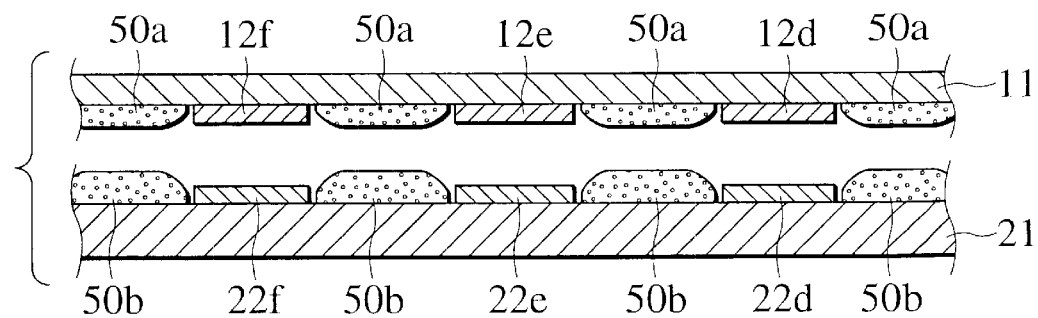
Figure 9D:
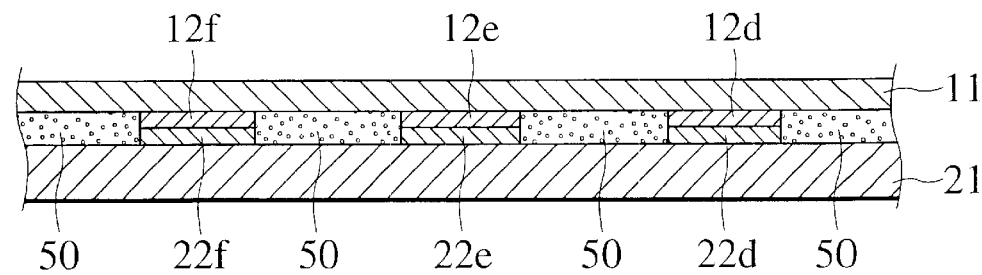

(iii) Then, as shown in FIG. 9C, the Al wirings 12d, 12e, 12f on the PET substrate 11 side are aligned and mated with the packaging wirings 22d, 22e, 22f on the packaging substrate 21 side. Then, the pressure is applied to both wirings such that the Al wirings 12d, 12e, 12f and the packaging wirings 22d, 22e, 22f are connected mutually. As a result, because the first adhesive layer 50a on the PET substrate 11 side and the second adhesive layer 50b on the packaging substrate 21 side are adhered with each other, the Al wirings 12d, 12e, 12f and the packaging wirings 22d, 22e, 22f are brought into their strong metal-metal contact state respectively. Meanwhile, the PET substrate 11 between the Al wirings 12d, 12e, 12f and the packaging substrate 21 between the packaging wirings 22d, 22e, 22f can be strongly adhered with the adhesive layer 50. Where the adhesive layer 50 is formed by merging the first adhesive layer 50a and the second adhesive layer 50b together so as to form one body.

In the inter-leads joint method, the first adhesive layer 50a and the second adhesive layer 50b are not always formed of conductive adhesive, and various adhesive materials each having a strong adhesive strength may be selected. In addition, if a low temperature thermosetting adhesive is employed, low temperature assembling of the flexible package onto the packaging substrate 21 can be accomplished at room temperature.

In summary, following advantages can be achieved in the first embodiment.

(1) Since the rigidity of the silicon chip is lowered by reducing extremely the thickness of the silicon chip 14 and at the same time respective constituent materials such as the interposer 11, etc. are formed flexibly by reducing their thicknesses, the low rigidity of the overall package can be achieved. As a result, generation of cracking, crazing due to displacement can be avoided, and thus the reliability as the product can be assured.

(2) The sealing member 16 such as ACF, ACR having low CTE α, is sandwiched between the interposer 11 and the silicon chip 14. Accordingly, the warping of the module generated due to the temperature during assembly of the module can be greatly reduced, thereby ensuring the flatness of the module.

(Second Embodiment)

A second embodiment of the present invention shows a MCM having a stacked structure in which the flexible packages are laminated by two layers. In other words, as shown in FIG. 10, the first and second flexible packages, having structure explained in the first embodiment shown in FIG. 2B, are laminated in a face up orientation along the vertical direction on the packaging substrate 21. On the principal surface of the packaging substrate 21, a plurality of packaging wirings 22a, . . . , 22j,... are formed. The packaging substrate 21 is formed of PWB, FPC, or the like, for example. Each of the plurality of radially-extending packaging wirings 22a, . . . , 22j, . . . has a thickness of 18 μm to 22 μm.

The first flexible package has a first flexible substrate 112, a first flexible semiconductor chip 142 attached over a principal surface of the first flexible substrate 112, first joint metals 152a, . . . , 152j, . . . for connecting electrically the first flexible semiconductor chip 142 and the first flexible substrate 112 respectively, and a first sealing member 162 sandwiched between the first flexible substrate 112 and the first flexible semiconductor chip 142. This first flexible substrate 112 is formed of PET material. Then, the first flexible substrate 112 has a plurality of radially-extending aluminum (Al) wirings 122a, . . . , 122j, . . . on its principal surface as the first metal wirings. The first flexible semiconductor chip, or the silicon chip 142 has a plurality of first bonding pads 92a, . . . , 92j, . . . on the peripheral portion of the chip surface. The gold (Au) bumps 152a, . . . , 152j, . . . serving as the first joint metals connect electrically a plurality of first metal wirings 122a, . . . , 122j, . . . and a plurality of first bonding pads 92a, . . . , 92j, . . . formed on the first flexible semiconductor chip 142 respectively. That is, the first gold (Au) bump 152a is arranged on the first Al wiring 122a, . . . , the first gold (Au) bump 152j is arranged on the first Al wiring 122j, . . . . The first Al wiring 122a and the corresponding bonding pad 92a on the first silicon chip 142 are connected via the first gold (Au) bump 152a, . . . , the first Al wiring 122j and the corresponding bonding pad 92j on the first silicon chip 142 are connected via the first gold (Au) bump 152j, . . . , whereby the first flip-chip structure can be constructed. Then, in order to protect a surface of the first silicon chip 142 containing these bump-joint portions, a surface of the first silicon chip 142 is sealed with a first sealing member (underfill) 162.

Similarly, the second flexible package has a second flexible substrate (PET substrate) 111, a second flexible semiconductor chip 141 attached over a principal surface of the second flexible substrate 111, second joint metals 151a, . . . , 151j, . . . for connecting electrically the second flexible semiconductor chip 141 and the second flexible substrate 111, and a second sealing member 161 sandwiched between the second flexible substrate 111 and the second flexible semiconductor chip 141. This second flexible substrate 111 is formed of PET material. A plurality of second metal wirings 121a, . . . , 121j, . . . are formed on a principal surface of the second flexible substrate 111. The plurality of second metal wirings 121a, . . . , 121j, . . . are connected electrically to the plurality of first metal wirings 122a, . . . , 122j, . . . of the first flexible package respectively. The second flexible semiconductor chip, or the silicon chip 141 has a plurality of second bonding pads 91a, . . . , 91j, . . . on the surface. The gold (Au) bumps 151a, . . . , 151j, . . . serving as the second joint metals connect electrically a plurality of second bonding pads 91a, . . . , 91j, . . . formed on the second flexible semiconductor chip 141 and a plurality of second metal wirings 121a, . . . , 121j, . . . respectively, whereby the second flip-chip structure can be constructed.

Then, in the second flexible package, the second flexible substrate 111 on which the second metal wirings 121a, . . . , 121j, . . . are formed is folded downward such that the second Al wirings are positioned on the outside. Similarly, in the first flexible package, the first flexible substrate 112 on which the first Al wirings 122a, . . . , 122j, . . . are formed is folded downward such that the first Al wirings are positioned on the outside. Then, the first Al wiring 122a and the second Al wiring 121a are bonded mutually by conductive material (conductive adhesive material) 60, ..., the first Al wiring 122j and the second Al wiring 121j are bonded mutually by the conductive material (conductive adhesive material) 60, .... Therefore, electrical conduction of the corresponding Al wirings between the first and second flexible packages can be attained, so that the multi-level lamination of the flexible packages can be achieved.

Then, the first Al wiring 122a on the folded portion of the principal surface of the first flexible substrate 112 and the packaging wiring 22a on the packaging substrate 21 are joined to each other via the conductive material (conductive adhesive material) 60, ..., the first Al wiring 122j and the packaging wiring 22j are joined to each other via the conductive material (conductive adhesive material) 60, ..., whereby the MCM having the stacked structure according to the second embodiment of the present invention can be constructed.

(Third Embodiment)

Figure 11A:
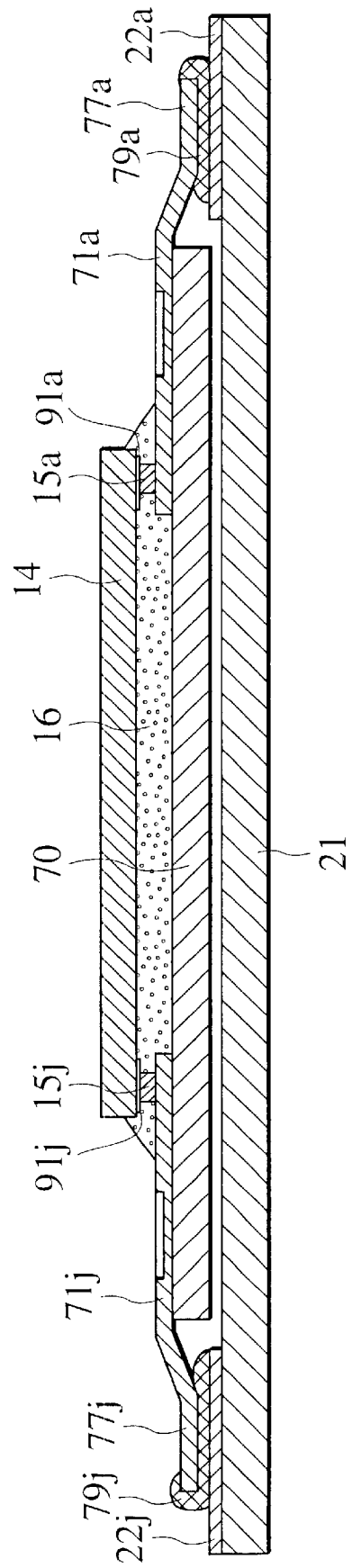
FIG. 11A is a sectional view showing structures of a flexible package and a module employing this package, according to a third embodiment of the present invention.

A flexible package according to a third embodiment of the present invention, whose sectional structure is shown in FIG. 11A, is a flexible package having beam leads, or metallic bars serving as outer leads. In the flexible package structure shown in FIG. 2B, a flexible substrate (polyimide substrate) 70 formed of the PET substrate 11 as the interposer. However, polyimide material is used in place of the PET substrate 11 as the interposer in the third embodiment. The modulus of elasticity of the polyimide material is higher than that of PET, and Young's modulus of polyimide material is 7.5 Gpa. Beam leads 71a, ..., 71j, ..., or copper prismatic bars 71a, ..., 71j, ... made from copper foils are formed on a principal surface of the polyimide substrate 70. A thickness of the polyimide substrate 70 is 40 $\mu$m, for example, and each thickness of the beam leads 71a, ..., 71j, ... is 15 $\mu$m, for example.

One ends of the beam leads 71a, ..., 71j, ... are connected to the Au bumps 15a, ..., 15j, ... of the very thin silicon chip 14 having a thickness of 50 $\mu$m, for example, by the flip-chip structure. The very thin silicon chip 14 has a plurality of bonding pads 91a, ..., 91j, ... on perimeter of the surface of the thin silicon chip 14. Gold bumps (joint metals) 15a, ..., 15j, ... are disposed between of pads 91a, ..., 91j, ... and the beam leads 71a, ..., 71j, ... for connecting electrically the pads 91a, ..., 91j, ... and the beam leads 71a, ..., 71j, ... respectively. In order to protect the surface of the silicon chip 14 containing these bump-joint portions, the silicon chip 14 is sealed with the underfill 16 such as ACP, ACR, etc. A thickness of the bump-joint portions 15a, ..., 15j, ... is 20 $\mu$m, for example. Then, as shown in FIG. 11A, the other ends of the beam leads 71a, ..., 71j, ... are connected to the packaging wirings 22a, ..., 22j, ... on the principal surface of the packaging substrate 21 by solders 79a, ..., 79j, ...

In the method of manufacturing the flexible package having such structure, a substrate in which a plurality of polyimide substrates 70 are periodically connected like a tape is employed instead of the tape-like PET 11 in respective steps explained with reference to FIGS. 8E to 8G according to the first embodiment. Also, since the copper prismatic bars (beam leads) 71a, ..., 71j, ... made of copper foils are employed in place of the Al wirings 12a, ..., 12j, ..., the steps in the method are slightly different. However, other steps are conducted by similar processes to mount the silicon chip 14 on the interposer.

Figure 11B:
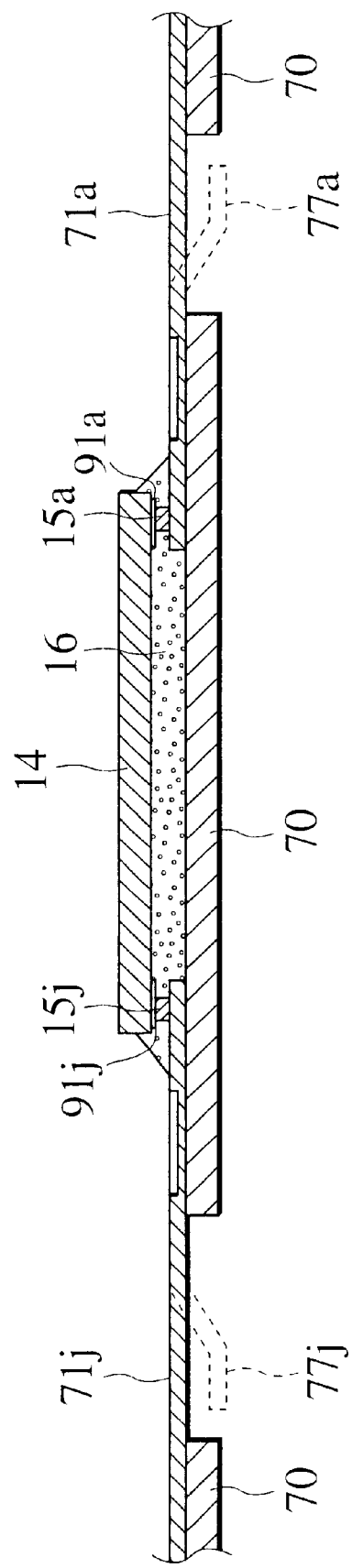
FIG. 11B is a sectional view showing a cut-off step applied to the flexible package, according to the third embodiment of the present invention.

The polyimide tape has a laminated double-layered structure consisting of the polyimide substrates 70 and the copper prismatic bars (beam leads) 71a, ..., 71j, ... In the step of cutting off the continuous tape, on which the polyimide substrates 70, 70, 70 ... are arranged and connected periodically, into individual packages, as shown in FIG. 11B, the beam leads 71a, ..., 71j, ... are cut off at regions, in which no polyimide substrate 70 exists, of the polyimide tape. According to this cut-off operation, the polyimide substrates 70, 70, 70 ... are separated individually and the desecrate flexible packages are cut away from the continuous tape. At the same time, lead terminals 77a, ..., 77j, ... are formed by bending the cut-off end portions of the beam leads 71a, ..., 71j, ... at a predetermined angle for assembling. Accordingly, the flexible package which is cut away into a piece has a shape to project the beam leads (outer-leads) 71a, ..., 71j, ... from the interposer 70.

The outer-leads terminals 77a, ..., 77j, ... which are the end portions of the outer-leads (beam leads) 71a, ..., 71j, ... are bonded to the corresponding wirings 22a, ..., 22j, ... on the packaging substrate 21 via a soldering method such as the outer-lead bonding (OLB) method by using solders 79a, ..., 79j, ... respectively, whereby a thin module having the structure shown in FIG. 11A can be completed.

In the flexible package according to the third embodiment of the present invention, since the polyimide, which has relatively higher thermal stability, is used as the interposer 70, high temperature packaging steps using solder reflow (heat treatment) process, as the premise, can be achieved by the similar package structure to the first embodiment. In this case, if only the OLB method is applied, the PET substrate whose heat resistance temperature is less than 150° C. can also be used.

Figure 12:
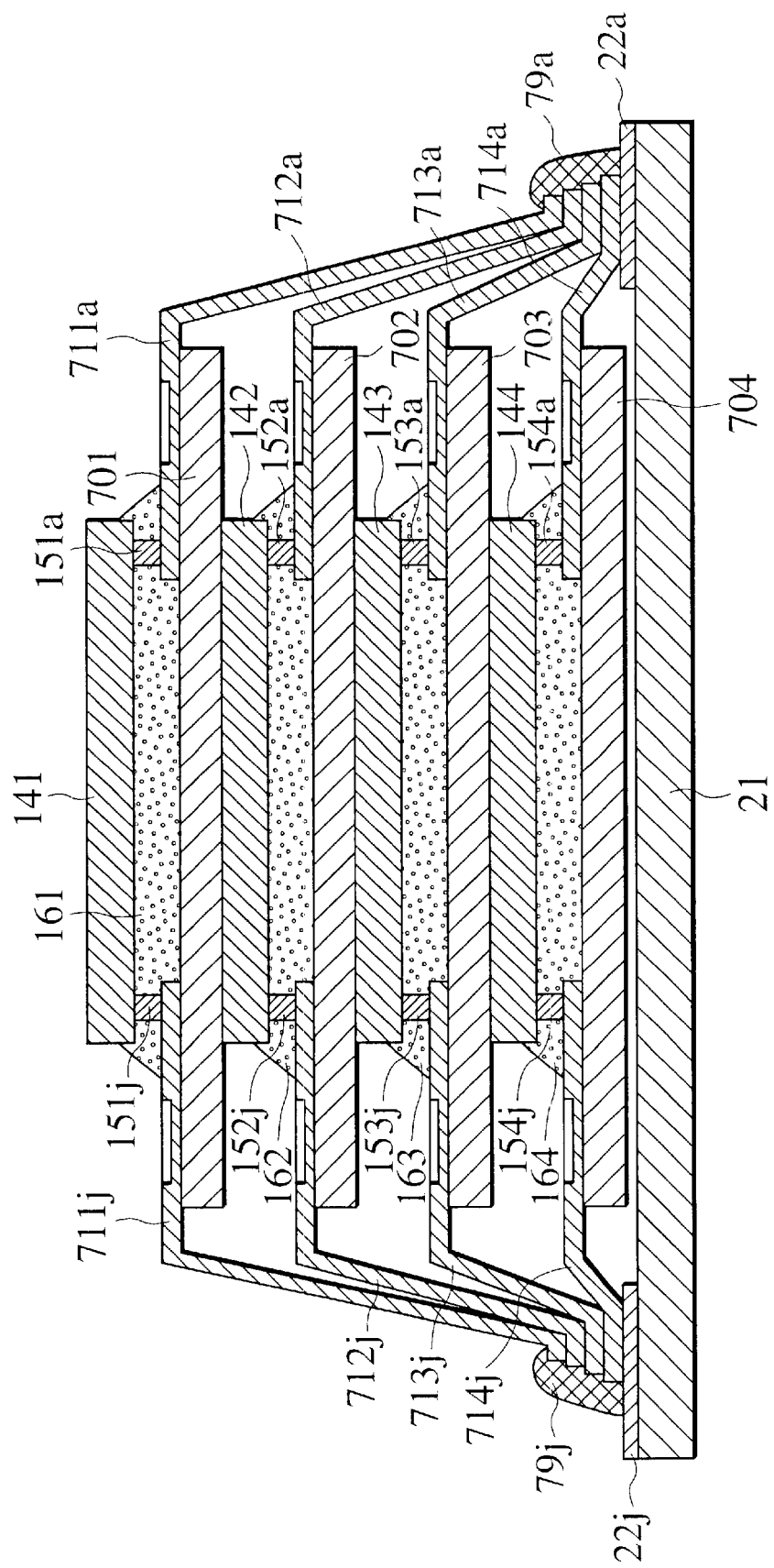
FIG. 12 is a sectional view showing a structure of the MCM, according to the third embodiment of the present invention.

In addition, an example of the stacked structure in which the flexible package according to the third embodiment of the present invention is laminated in a multi-level fashion is shown in FIG. 12. More particularly, four sheets of first to fourth flexible packages, each of which is similar to that shown in FIG. 11B, are laminated in the face up orientation along the vertical direction on the packaging substrate 21. That is, the first to fourth flexible packages are stacked over the packaging substrate 21, on which a plurality of packaging wiring 22a, ..., 22j, ... are disposed. The packaging substrate 21 is composed of PWB, FPC, etc., for example. The packaging wirings 22a, ..., 22j, ... are delineated as a plurality of radial patterns each having a thickness of 18 $\mu$m to 22 $\mu$m.

The first flexible package has a first flexible substrate 704, a first flexible semiconductor chip 144 attached over a principal surface of the first flexible substrate 704, first joint metals 154a, ..., 154a, ... for connecting electrically the first flexible semiconductor chip 144 and the first flexible substrate 704, and a first sealing member 164 sandwiched between the first flexible substrate 704 and the first flexible semiconductor chip 144. This first flexible substrate 704 is formed of polyimide material. Then, the first flexible substrate 704 has a plurality of radially-extending beam leads (copper prismatic bars) 714a, ..., 714j, ..., each has a thickness of 15 $\mu$m on its principal surface as the first metal wirings. The first flexible semiconductor chip consists of the silicon chip 144, and has a plurality of first bonding pads (although not shown for avoiding cluttering up of the drawing), on the peripheral portion of the surface of the chip 144. The gold (Au) bumps 154a, ..., 154a, ... serving as the first joint metals connect electrically the plurality of first metal wirings 714a, ..., 714j, ... and the plurality of first bonding pads disposed on the first flexible semiconductor chip 144 respectively. That is, the first gold (Au) bump 154a is arranged on the first beam lead (copper prismatic bars) 714a, ..., the first gold (Au) bump 154j is arranged on the first beam lead (copper prismatic bars) 714j, ... . The first beam lead (copper prismatic bars) 714a and the corresponding bonding pad on the first silicon chip 144 are connected via the first gold (Au) bump 154a, ..., the first beam lead (copper prismatic bars) 714j and the corresponding bonding pad on the first silicon chip 144 are connected via the first gold (Au) bump 154j, ..., whereby the first flip-chip structure can be constructed. Then, in order to protect a surface of the first silicon chip 144 containing these bump-joint portions, a surface of the first silicon chip 144 is sealed with a first sealing member (underfill) 164.

Similarly, the second flexilble package has a second flexible substrate (polyimide substrate) 703, a second flexible semiconductor chip 143 attached over a principal surface of the second flexible substrate 703, second joint metals 153a, ..., 153j, ... for connecting electrically the second flexible semiconductor chip 143 and the second flexible substrate 703, and a second sealing member 163 sandwiched between the second flexible substrate 703 and the second flexible semiconductor chip 143. Then, a plurality of second metal wiringgs 713a, ..., 713j, ... are formed on the principal surface of the second flexible substrate 703. The plurality of second beam leads (copper prismatic bars) 713a, ..., 713j, ... are connected electrically to a plurality of first beam leads (copper prismatic bars) 714a, ..., 714j, ... of the first flexible package respectively. The second flexible semiconductor chip is formed of the silicon chip 143 and has a plurality of second bonding pads 91a, ..., 91j, ... on its surface. The gold (Au) bumps 153a, ..., 153j, ... serving as the second joint metals connect electrically the plurality of second bonding pads 91a, ..., 91j, ... on the second flexible semiconductor chip 143 and the plurality of second beam leads (copper prismatic bars) 713a, ..., 713j, ... respectively, whereby the first flip-chip structure can be constructed.

Similarly, the third flexible package has a third flexible substrate (polyimide substrate) 702 and a third semiconductor chip 142 disposed on the third polyimide substrate 702. On a principal surface of third polyimide substrate 702, third beam leads 712a, ..., 712j, ... are arranged. Then, the third gold (Au) bump 152a is arranged on the third beam lead 712a which is formed on the principal surface of the third flexible substrate (polyimide substrate) 702, ..., the third gold (Au) bump 152j is arranged on the third beam lead 712j, ... The third beam lead 712a and the corresponding bonding pad on the third silicon chip 142 are connected via the third gold (Au) bump 152a, ..., the third beam lead 712j and the corresponding bonding pad on the third silicon chip 142 are connected via the third gold (Au) bump 152j, ..., whereby the third flip-chip structure can be constructed. Then, in order to protect a surface of the third silicon chip 142 containing these bump-joint portions, a surface of the third silicon chip 142 is sealed with a third underfill 162.

The fourth flexible package has a fourth flexible substrate 701 and a fourth silicon chip 141 disposed on the fourth flexible substrate 701. The fourth flexible substrate 701 is made of polyimide material. A plurality of radially-extending beam leads 121a, ..., 121j, ... are arranged on a principal surface of the fourth flexible substrate 701. Then, the fourth gold (Au) bump 151a is arranged on the fourth beam lead 711a which is formed on the principal surface of the fourth flexible substrate 701, ..., the fourth gold (Au) bump 151j is arranged on the fourth beam lead 711j, ... Then, the fourth beam lead 711a and the corresponding bonding pad on the fourth silicon chip 141 are connected via the fourth gold (Au) bump 151a, ..., the fourth beam lead 711j and the corresponding bonding pad on the fourth silicon chip 141 are connected via the fourth gold (Au) bump 151j, ... Then, the fourth flip-chip structure is constructed. Further, in order to protect a surface of the fourth silicon chip 141 containing these bump-joint portions, a surface of the fourth silicon chip 141 is sealed with a fourth underfill 161.

Next, the beam leads (outer leads) 711a, 712a, 713a, and 714a of the first, second, third, and fourth flexible packages are respectively led to be brought together to the packaging wiring 22a and then secured by the solder 79j. Similarly, the beam leads (outer leads) 711j, 712j, 713j, and 714j of the first, second, third, and fourth flexible packages are led to be brought together to the packaging wiring 22j and then secured by the solder 79j. As stated above, the MCM having quadruple-layered stacked structure is assembled.

(Fourth Embodiment)

FIG. 13 is a sectional view showing structures of a flexible package and a module employing this package, according to a fourth embodiment of the present invention. The flexible package according to the fourth embodiment of the present invention has a curved flexible substrate 11 having a predetermined curvature, made of PET material. On a principal surface of the curved flexible substrate 11, a plurality of radially-extending aluminum (Al) wirings 12a, ..., 12j, ... are arranged. The flexible package according to the fourth embodiment is, further constructed by a curved silicon chip 14 disposed in a face down orientation, on the curved flexible substrate 11 Then, the gold (Au) bump 15a is arranged on the Al wiring 12a which is formed on the principal surface of the curved flexible substrate (PET substrate) 11, ..., the gold (Au) bump 15j is arranged on the Al wiring 12j, ... Then, the Al wirings 12a, 12j and the corresponding bonding pads 91a, ..., 91j, ... on the silicon chip 14 are connected via the gold (Au) bumps 15a, 15j respectively to thus construct the flip chip structure. Each thickness of the gold (Au) bumps 15a, ..., 15j, ... is 20 $\mu$m, for example. In order to protect a surface of the silicon chip 14 containing the bump-joint portions, a surface of the silicon chip 14 is sealed with an underfill 16. As the underfill 16, the sealing adhesive such as the ACF or the ACR, having a low CTE ($\alpha$=0.1 to 15 ppm/°C.) is employed.

A plurality of radially-extending packaging wirings 22a, ..., 22j, ... are arranged on the principal surface of the curved packaging substrate 21 such as PWC, FPC, etc. Then, the Al wiring 12a on the principal surface of the curved flexible substrate 11 and the packaging wiring 22a on the principal surface of the curved packaging substrate 21 are bonded mutually via the conductive adhesive layer, ..., the Al wiring 12j and the packaging wiring 22j are bonded mutually via the conductive adhesive layer, ..., whereby the module according to the fourth embodiment of the present invention can be constructed.

The module according to the fourth embodiment of the present invention shown in FIG. 13 can be interpreted as an example in which the flexible package according to the first embodiment, for example, is packaged on the curved packaging substrate 21. In other words, since thicknesses of respective constitute materials of the package including the silicon chip 14 are extremely reduced, the rigidity of the package becomes low and thus the substrate can be installed onto the curved surface by positively bending the package.

For instance, the module, in which the silicon chip 14 configured as an integrated pressure sensor, an integrated temperature sensor, etc. is installed, can be attached onto a curved surface 81 of a pipe or a motor. Otherwise, the module, in which the silicon chip 14 configured as a fingerprint identification integrated circuit is mounted, can be attached onto a penholder portion of a ball-point pen, etc.

The module according to the fourth embodiment of the present invention, since the overall thickness is extremely reduced and thus the rigidity is made small, the destruction or failure of the module is not brought about by bending the IC card, etc. Then we can understand that the module according to the fourth embodiment can be applied to the IC card, etc., and the module is very effective in practical use. In other words, the curved packaging substrate 21 shown in FIG. 13 should be interpreted such that it can exist as not only the stationary shape but also one of instantaneous shapes.

(Other Embodiment)

Various modifications will becomes possible for those skilled in the art after receiving the teachings of the present disclosure without departing from the scope thereof. For example, in the flexible packages according to the first to fourth embodiments of the present invention, the silicon chips 14 are mounted on the principal surfaces of the flexible substrates 11, 111, 112, 70, 701 to 704 as the flip-chip structure respectively. However, there is no necessity that the silicon chip should be always mounted on the principal surface of the flexible substrate as the flip-chip configuration, in which the silicon chip is attached in the face down orientation.

FIG. 14A is a sectional view showing a structure of a flexible package according to other embodiment of the present invention. The flexible package according to other embodiment has is a flexible substrate 11 and a silicon chip 14 on the flexible substrate 11, on the principal surface of which a plurality of radially-extending aluminum (Al) wirings 12a, . . . , 12j, . . . are arranged. However, the silicon chip 14 is attached to the flexible substrate 11 in a face up orientation, directing its surface on which the semiconductor integrated circuits are formed upward. The metal wirings and the bonding pads 91a, . . . , 91j, . . . , 91k, . . . , 91m, . . . are formed on the surface of the silicon chip 14. Also, via holes are provided through the silicon chip 14 and then buried joint metals 192a, . . . , 192j, . . . are embedded in the via holes. As the buried joint metals 192a, . . . , 192j, . . . , a refractory metal such as tungsten (W), titanium (Ti), molybdenum (Mo), or the like, or silicide (WSi$_2$, TiSi$_2$, MoSi$_2$) of these metals, etc. may be employed. The via holes can be opened simply since the silicon chip 14 is very thin. For example, if trenches whose depth is set larger than the final thickness of the silicon chip 14 are formed by the RIE method, etc. prior to the grinding step shown in FIGS. 8A to 8C, the via holes can be opened automatically at the end of the grinding step. Meanwhile, like the first embodiment, the gold (Au) bumps 15a, . . . , 15j, . . . are also arranged on the Al wirings 12a, . . . , 12j, . . . which are formed on the principal surface of the flexible substrate 11 as shown in FIG. 14A. In this manner, the gold (Au) bumps 15a, . . . , 15j, . . . and the bonding pads 91a, . . . , 91j, . . . formed on the front surface of the silicon chip 14 are connected mutually via the buried joint metals 192a, . . . , 192j, . . . respectively.

In FIG. 14A, the buried joint metals 192a, . . . , 192j, . . . and the gold (Au) bumps 15a, . . . , 15j, . . . can function as the joint metals of the present invention. Then, in order to protect the surface of the silicon chip 14 containing the bump-joint portions, the surface of the silicon chip 14 is sealed with the underfill 16. Since the silicon chip 14 is thin, the solder may be used as the buried joint metals 192a, . . . , 192j, . . . to bury fully the inside of the via holes.

As shown in FIG. 14B, in a flexible package according to still other embodiment of the present invention, the silicon chip 14 is arranged on the flexible substrate 11 in the face up orientation, like FIG. 14A. The metal wirings and the bonding pads 91a, . . . , 91j, . . . , 91k, . . . , 91m, . . . are formed on the surface of the silicon chip 14. Then, the Al wirings 12a, . . . , 12j, . . . on the principal surface of the flexible substrate 11 and the bonding pads 91a, . . . , 91j, . . . . are connected by the solders 95, . . . , 95j, . . . on the side surface of the silicon chip 14 respectively. In FIG. 14B, the solders 95, . . . , 95j, . . . can function as the joint metals of the present invention. Since the silicon chip 14 is extremely thin, such connection utilizing the solder may be used.

Also, in the flexible packages according to the first to fourth embodiments of the present invention, the silicon chips 14, 141 to 144 are explained by way of examples. However, it is of course that other semiconductor substrates such as a gallium arsenide (GaAs) chip, etc. may also be employed. In this way, it is a matter of course that various embodiments which are not set forth in this disclosure may be contained in the present invention. Accordingly, the technical scope of the present invention should be defined only by following claims in view of the above explanations.

What is claimed is:

1. A flexible package configured such that it can be attached on a curved surface, the flexible package comprising:

a flexible substrate having a thickness larger than 10 μm and smaller than or equal to 40 μm, disposing a plurality of metal wirings on a principal surface of the flexible substrate;

a flexible semiconductor chip, configured such that the chip can be bent to have a radius of curvature smaller than 80 mm, the chip being attached over the flexible substrate and having a plurality of bonding pads thereon;

joint metals for electronically connecting the plurality of bonding pads and the plurality of metal wirings, respectively; and a sealing member sandwiched between the flexible substrate and the flexible semiconductor chip.

2. The flexible package of claim 1, wherein a thickness of the flexible semiconductor chip is larger than 10 μm and smaller than 100 μm.

3. The flexible package of claim 2, wherein a thickness of the flexible semiconductor chip is larger than 30 μm.

4. The flexible package of claim 2, wherein the flexible semiconductor chip is a silicon chip.

5. The flexible package of claim 1, wherein the flexible semiconductor chip is attached over the flexible substrate in a flip-chip configuration.

6. The flexible package of claim 1, wherein the flexible substrate is a polyethylene terephthalate substrate.

7. The flexible package of claim 6, wherein a thickness of the flexible substrate is larger than 10 μm and smaller than or equal to 38 μm.

8. The flexible package of claim 1, wherein the sealing member is material with a linear coefficient of thermal expansion α=0.01 to 30 ppm/°C.

9. The flexible package of claim 1, wherein the sealing member is material with a linear coefficient of thermal expansion α=0.1 to 15 ppm/°C.

10. The flexible package of claim 1, wherein the metal wirings on the flexible substrate are arranged as beam leads.

11. The flexible package of claim 1, wherein the joint metals for connecting the metal wirings on the flexible substrate are bumps made of highly conductive material.

12. The flexible package of claim 1, wherein the flexible semiconductor chip is cut to a rectangular shape having a base and a height, the base being longer than the height, grinding traces being formed on a back surface of the flexible semiconductor chip.

13. The flexible package of claim 12, wherein an angle between the grinding trace and the base is smaller than or equal to 10°.

14. A flexible module configured such that it can be attached on a curved surface, the flexible module comprising:
- a packaging substrate having a plurality of packaging wirings on a principal surface of the substrate;
- a flexible substrate having a thickness larger than 10 $\mu$m and smaller than or equal to 40 $\mu$m, disposing a plurality of metal wirings electrically connected to the plurality of packaging wirings, respectively, on a principal surface;
- a flexible semiconductor chip, configured such that the chip can be bent to have a radius of curvature smaller than 80 mm, the chip having a plurality of bonding pads and being attached over the principal surface of the flexible substrate;
- joint metals for electrically connecting the plurality of bonding pads and the plurality of metal wirings respectively; and
- a sealing member sandwiched between the flexible substrate and the flexible semiconductor chip.

15. The flexible module of claim 14, wherein a thickness of the flexible semiconductor chip is larger than 10 $\mu$m and smaller than 100 $\mu$m.

16. The flexible module of claim 14, wherein the flexible semiconductor chip is a silicon chip.

17. The flexible module of claim 14, wherein the flexible semiconductor chip is attached over the flexible substrate in a flip-chip configuration.

18. The flexible module of claim 14, wherein the flexible substrate is a polyethylene terephthalate substrate.

19. The flexible module of claim 18, wherein a thickness of the flexible substrate is larger than 10 $\mu$m and smaller than or equal to 38 $\mu$m.

20. The flexible module of claim 14, wherein the sealing member is material with a linear coefficient of thermal expansion $\alpha=0.01$ to 30 ppm/°C.

21. The flexible module of claim 14, wherein the metal wirings on the flexible substrate are arranged as beam leads.

22. The flexible module of claim 14, wherein the packaging substrate is a curved packaging substrate.

23. A multi chip module configured such that it can be attached on a curved surface, the multi chip module comprising:
- a packaging substrate having a plurality of packaging wirings on a principal surface of the substrate;
- a first flexible substrate having a thickness larger than 10 $\mu$m and smaller than or equal to 40 $\mu$m, disposing a plurality of first metal wirings connected electrically to the plurality of packaging wirings, respectively, on a principal surface;
- a first flexible semiconductor chip, configured such that the chip can be bent to have a radius of curvature smaller than 80 mm, having a plurality of first bonding pads and being attached over the principal surface of the first flexible substrate;
- first joint metals for electrically connecting the plurality of first bonding pads and the plurality of first metal wirings, respectively;
- a first sealing member sandwiched between the first flexible substrate and the first flexible semiconductor chip;
- a second flexible substrate having a thickness larger than 10 $\mu$m and smaller than or equal to 40 $\mu$m, disposing a plurality of second metal wirings connected electrically to the plurality of first metal wirings, respectively, on a principal surface;
- a second flexible semiconductor chip, configured such that the chip can be bent to have a radius of curvature smaller than 80 mm, having a plurality of second bonding pads and being attached over the principal surface of the second flexible substrate;
- second joint metals for electrically connecting the plurality of second bonding pads and the plurality of second metal wirings, respectively; and
- a second sealing member sandwiched between the second flexible substrate and the second flexible semiconductor chip.

24. The multi chip module of claim 23, wherein the first flexible substrate is folded at its peripheral portion such that the first metal wirings are positioned on an outside, and the first metal wirings on a folded portion of the first flexible substrate are connected to the packaging wirings via conductive materials.

25. The multi chip module of claim 23, wherein the second flexible substrate is folded at its peripheral portion such that the second metal wirings are positioned on an outside, and the second metal wirings on a folded portion of the second flexible substrate are connected to the first metal wirings via the conductive materials.

26. The multi chip module of claim 23, wherein the plurality of first metal wirings are formed of a plurality of first beam leads, and the plurality of second metal wirings are formed of a plurality of second beam leads.

27. The multi chip module of claim 26, wherein the plurality of first metal wirings and the plurality of second metal wirings are electrically connected mutually as pairs of corresponding wirings.

28. A method for manufacturing a module, comprising the steps of:

(a) reducing a thickness of a semiconductor chip to larger than 10 $\mu$m and smaller than 100 $\mu$m so that the chip can be bent to have a radius of curvature smaller than 80 mm;

(b) delineating a plurality of packaging wirings on a principal surface of a packaging substrate;

(c) delineating a plurality of metal wirings on a principal surface of a flexible substrate;

(d) mounting the semiconductor chip over the principal surface of the flexible substrate having a thickness larger than 10 $\mu$m and smaller than or equal to 40 $\mu$m; and (e) aligning the plurality of packaging wirings and the plurality of metal wirings, and connecting electrically them mutually.

29. The method of claim 28, wherein the step of mounting the semiconductor chip deposits selectively a sealing member in a chip mounting region on a principal surface of the flexible substrate, and attaches the semiconductor chip at positions of the sealing member.

30. The method of claim 28, wherein the step of electrically connecting the packaging wirings and the metal wirings mutually, further comprises the steps of:
  (a) selectively providing a first adhesive layer only onto exposed portions of the flexible substrate between the plurality of metal wirings;
  (b) selectively providing a second adhesive layer only onto exposed portions of the packaging substrate between the plurality of packaging wirings; and
  (c) aligning the metal wirings and the packaging wirings, and applying a predetermined pressure between the flexible substrate and the packaging substrate to bond the first adhesive layer and the second adhesive layer so that the metal wirings directly contact the packaging wirings.

* * * * *